United States Patent
Song et al.

(10) Patent No.: US 9,622,338 B2
(45) Date of Patent: *Apr. 11, 2017

(54) FREQUENCY SELECTIVE STRUCTURES FOR EMI MITIGATION

(71) Applicant: Laird Technologies, Inc., Earth City, MO (US)

(72) Inventors: John Song, Barrington, IL (US); Paul Francis Dixon, Sharon, MA (US)

(73) Assignee: Laird Technologies, Inc., Earth City (*) Notice: Subject to any disclaimer, the term of this patent is extended or adjusted under 35 U.S.C. 154(b) by 105 days.

This patent is subject to a terminal disclaimer.

(21) Appl. No.: 14/814,008

(22) Filed: Jul. 30, 2015

(65) Prior Publication Data

US 2015/0342031 A1    Nov. 26, 2015

Related U.S. Application Data

(63) Continuation-in-part of application No. PCT/US2014/012551, filed on Jan. 22, 2014, which
(Continued)

(51) Int. Cl.
*H05K 1/02* (2006.01)
*H01L 23/552* (2006.01)
(Continued)

(52) U.S. Cl.
CPC ......... *H05K 1/0224* (2013.01); *H01L 23/552* (2013.01); *H01Q 15/0026* (2013.01);
(Continued)

(58) Field of Classification Search
CPC ............... H05K 1/0224; H05K 1/0243; H05K 2201/09681; H01Q 15/0026; H01Q 17/00;
(Continued)

(56) References Cited

U.S. PATENT DOCUMENTS 5,276,277 A    1/1994    Hightower et al.
6,218,978 B1   4/2001    Simpkin et al.
(Continued)

FOREIGN PATENT DOCUMENTS

EP    2148386    1/2010
EP    2573864    3/2013
(Continued)

OTHER PUBLICATIONS

International Search Report and Written Opinion dated Nov. 8, 2016 for PCT Application No. PCT/US2016/044672 filed Jul. 29, 2016 which is the parent application to the instant application; 9 pages.
(Continued)

*Primary Examiner* — John B Sotomayor
(74) *Attorney, Agent, or Firm* — Harness, Dickey & Pierce, P.L.C.

(57) ABSTRACT

According to various aspects, exemplary embodiments include one or more frequency selective structures (e.g., two-dimensional or three-dimensional frequency selective structure or surface, etc.), which may be used for shielding or mitigating EMI within open or closed structures. Also disclosed are methods of using one or more frequency selective structures for shielding or mitigating electromagnetic interface (EMI) within open or closed structures.

20 Claims, 10 Drawing Sheets

Related U.S. Application Data is a continuation-in-part of application No. 13/853,248, filed on Mar. 29, 2013, now Pat. No. 9,307,631, and a continuation-in-part of application No. 13/750,680, filed on Jan. 25, 2013, now Pat. No. 9,173,333, said application No. 13/853,248 is a continuation-in-part of application No. 13/750,680, filed on Jan. 25, 2013, now Pat. No. 9,173,333.

(51) Int. Cl.
*H01Q 15/00* (2006.01)
*H01Q 17/00* (2006.01)

(52) U.S. Cl.
CPC ..... *H01Q 17/00* (2013.01); *H01L 2924/0002* (2013.01); *H05K 1/0243* (2013.01); *H05K 2201/09681* (2013.01); *Y10T 29/49002* (2015.01); *Y10T 29/49897* (2015.01)

(58) Field of Classification Search
CPC ........... H01L 23/552; H01L 2924/0002; Y10T 29/49002; Y10T 29/49897
USPC ........... 342/1–11, 13–15, 175; 174/388, 350; 29/600
See application file for complete search history.

(56) References Cited

U.S. PATENT DOCUMENTS

| | | | |
|---|---|---|---|
| 6,473,048 | B1 | 10/2002 | Diaz |
| 6,734,045 | B2 | 5/2004 | Morris |
| 6,818,821 | B2 | 11/2004 | Fujieda et al. |
| 6,870,092 | B2 | 3/2005 | Lambert et al. |
| 7,030,463 | B1 | 4/2006 | Subramanyam et al. |
| 7,038,124 | B1 | 5/2006 | Sosnowski |
| 7,135,643 | B2 | 11/2006 | van Haaster et al. |
| 7,338,547 | B2 | 3/2008 | Johnson et al. |
| 7,608,326 | B2 | 10/2009 | Johnson |
| RE41,594 | E | 8/2010 | Lambert et al. |
| RE42,512 | E | 7/2011 | Lambert et al. |
| 8,018,375 | B1 | 9/2011 | Alexopoulos et al. |
| 8,106,850 | B1 | 1/2012 | Gregoire et al. |
| 8,138,673 | B1 | 3/2012 | Wedding |
| 8,643,532 | B1 | 2/2014 | Puscasu et al. |
| 2001/0036217 | A1 | 11/2001 | Kopf et al. |
| 2003/0034933 | A1* | 2/2003 | Frenkel ............... H01Q 15/0013 343/872 |
| 2004/0263420 | A1 | 12/2004 | Werner et al. |
| 2006/0114170 | A1 | 6/2006 | Sievenpiper |
| 2007/0042819 | A1 | 2/2007 | Li et al. |
| 2007/0095567 | A1 | 5/2007 | Boyce et al. |
| 2007/0222658 | A1 | 9/2007 | Puscasu et al. |
| 2008/0055023 | A1 | 3/2008 | Gevorgian et al. |
| 2008/0238801 | A1 | 10/2008 | Ragan |
| 2009/0167628 | A1* | 7/2009 | Frenkel ............... H01Q 1/002 343/872 |
| 2009/0284404 | A1 | 11/2009 | Sim et al. |
| 2010/0097048 | A1 | 4/2010 | Werner et al. |
| 2010/0156695 | A1 | 6/2010 | Sim et al. |
| 2011/0089239 | A1* | 4/2011 | Fixter ............... G06K 7/10346 235/439 |
| 2011/0133978 | A1 | 6/2011 | Sim |
| 2011/0304005 | A1 | 12/2011 | Brueckl et al. |
| 2011/0316734 | A1* | 12/2011 | Svensson ............... H01Q 9/16 342/175 |
| 2012/0062346 | A1 | 3/2012 | McKinzie, III |
| 2012/0086463 | A1 | 4/2012 | Boybay et al. |
| 2012/0098628 | A1 | 4/2012 | Batchelor et al. |
| 2012/0119932 | A1 | 5/2012 | MacDonald et al. |
| 2012/0281360 | A1 | 11/2012 | Nicol et al. |
| 2013/0127651 | A1 | 5/2013 | De Barros et al. |
| 2014/0111364 | A1 | 4/2014 | Sjolund |
| 2014/0125506 | A1 | 5/2014 | Sjolund |
| 2014/0209373 | A1 | 7/2014 | Song et al. |
| 2014/0209374 | A1 | 7/2014 | Song et al. |
| 2015/0042502 | A1 | 2/2015 | Gorriti Gonzalez et al. |

FOREIGN PATENT DOCUMENTS

| | | |
|---|---|---|
| JP | 2007180113 A | 7/2007 |
| JP | 2008-283225 A | 11/2008 |
| JP | 2011176255 | 9/2011 |
| JP | 2012209577 A | 10/2012 |
| KR | 1020120050391 | 5/2012 |
| KR | 1020120072018 | 7/2012 |
| TW | 566077 B | 12/2003 |
| TW | 200418560 A | 10/2004 |
| TW | M308849 U | 4/2007 |
| WO | 2007051487 | 5/2007 |
| WO | 2013016922 | 2/2013 |
| WO | 2014116703 | 1/2014 |

OTHER PUBLICATIONS

86250 Nickel/Copper Black Fabric Tape; www.lairdtech.com; .Copyrgt. 2012; 2 pgs.

Emerson & Cumings; http://www.eccosorb.com/Collateral/Documents/English-US/ANW.pdf; May 11, 2007; 2 pgs.

Design of Metamaterial-Based Resonant Microwave Absorbers with Reduced Thickness and Absence of a Metallic Backing ; F. Bilotti and L. Vegni; 2009; http://xa.yimg.com/kq/groups/13354653/361229153/name/fulltext(5).pd- f; 10 pgs.

Dampening Cavity Resonance Using Absorber Material; P. Dixon; May 2004; 3 pgs. http://www.eccosorb.com/Collateral/Documents/English-US/BSR.pdf.

International Search Report and Written Opinion dated May 14, 2014 for PCT Application No. PCT/US2014/012551 filed Jan. 22, 2014 which claims priority to the instant application; 11 pages.

Eccosorb.RTM. BSR; http://www.eccosorb.com/Collateral/Documents/English-US/Cavity%20Resonanc-e%20IEE%20Article.pdf; Oct. 8, 2008; 1 pg.

Cavity-Resonance Dampening; P. Dixon; Jun. 2005; 7 pgs. http://www.eccosorb.com/Collateral/Docurnents/English-US/SF.pdf.

"Everything You Ever Wanted to Know About Frequency-Selective Surface Filters but Were Afraid to Ask", B. Hooberman.cndot., May 2005; 22 pgs.; http://calvin.phys.columbia.edu/group.sub.--web/filter.sub.--development/-download/filter.pdf. cited byapplicant.

Nonfinal Office Action dated Oct. 2, 2015 issued for U.S. Appl. No. 13/853,248 which claims priority to the same parent application as the instant application.

Taiwan Office Action and its English translation from Taiwan patent application No. 103102627 filed Jan. 24, 2014 which claims priority to the same parent application as the instant application; dated Jun. 17, 2016; 15 pages.

* cited by examiner

FREQUENCY SELECTIVE STRUCTURES FOR EMI MITIGATION

CROSS-REFERENCE TO RELATED APPLICATIONS

This application is a continuation-in-part of PCT International Application No. PCT/US2014/012551 filed Jan. 22, 2014 (published as WO2014/116703 on Jul. 31, 2014), which, in turn, claimed priority to U.S. patent application Ser. No. 13/853,248 filed Mar. 29, 2013 and U.S. patent application Ser. No. 13/750,680 filed Jan. 25, 2013.

This application is a continuation-in-part of U.S. patent application Ser. No. 13/853,248 filed Mar. 29, 2013 (published as US2014/0209374 on Jul. 31, 2014), which, in turn, was a continuation-in-part of U.S. patent application Ser. No. 13/750,680 filed Jan. 25, 2013.

This application is a continuation-in-part of U.S. patent application Ser. No. 13/750,680 filed Jan. 25, 2013 (published as US2014/0209373 on Jul. 31, 2014).

The entire disclosure of each of the above applications is incorporated herein by reference.

FIELD

The present disclosure relates to frequency selective structures (e.g., two-dimensional or three-dimensional frequency selective structure or surface, etc.) for shielding or mitigating electromagnetic interface (EMI).

BACKGROUND

This section provides background information related to the present disclosure which is not necessarily prior art.

The operation of electronic devices generates electromagnetic radiation within the electronic circuitry of the equipment. Such radiation may result in electromagnetic interference (EMI) or radio frequency interference (RFI), which can interfere with the operation of other electronic devices within certain proximity. Without adequate shielding, EMI/RFI interference may cause degradation or complete loss of important signals, thereby rendering the electronic equipment inefficient or inoperable.

A common solution to ameliorate the effects of EMI/RFI is through the use of shields capable of absorbing and/or reflecting and/or redirecting EMI energy. These shields are typically employed to localize EMI/RFI within its source, and to insulate other devices proximal to the EMI/RFI source.

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) broadly includes and refers to mitigating (or limiting) EMI and/or RFI, such as by attenuating, absorbing, reflecting, blocking, and/or redirecting the energy or some combination thereof so that it no longer interferes, for example, for government compliance and/or for internal functionality of the electronic component system.

SUMMARY

This section provides a general summary of the disclosure, and is not a comprehensive disclosure of its full scope or all of its features.

According to various aspects, exemplary embodiments include one or more frequency selective structures (e.g., two-dimensional or three-dimensional frequency selective structures or surfaces, etc.), which may be used for shielding or mitigating EMI within open or closed structures. Also disclosed are methods of using one or more frequency selective structures for shielding or mitigating electromagnetic interface (EMI) within open or closed structures.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1 illustrates a printed circuit board (PCB) having an integrated circuit, a frequency selective surface/periodic structure within the PCB, and a frequency selective surface/periodic structure applied or disposed over the integrated circuit whereby the frequency selective/periodic structures are operable for providing shielding to the integrated circuit according to exemplary embodiments.

FIG. 2 illustrates an exemplary embodiment of a frequency selective structure that may be used as a single band or multiband bandstop waveguide and/or shielding structure, where the frequency selective structure may include any suitable number of suitably configured (e.g., shaped and sized, etc.) electrically-conductive, electromagnetic energy absorbing, and/or magnetic members (e.g., rings and/or other configurations, etc.) as represented by the series of dots.

Figure 8:
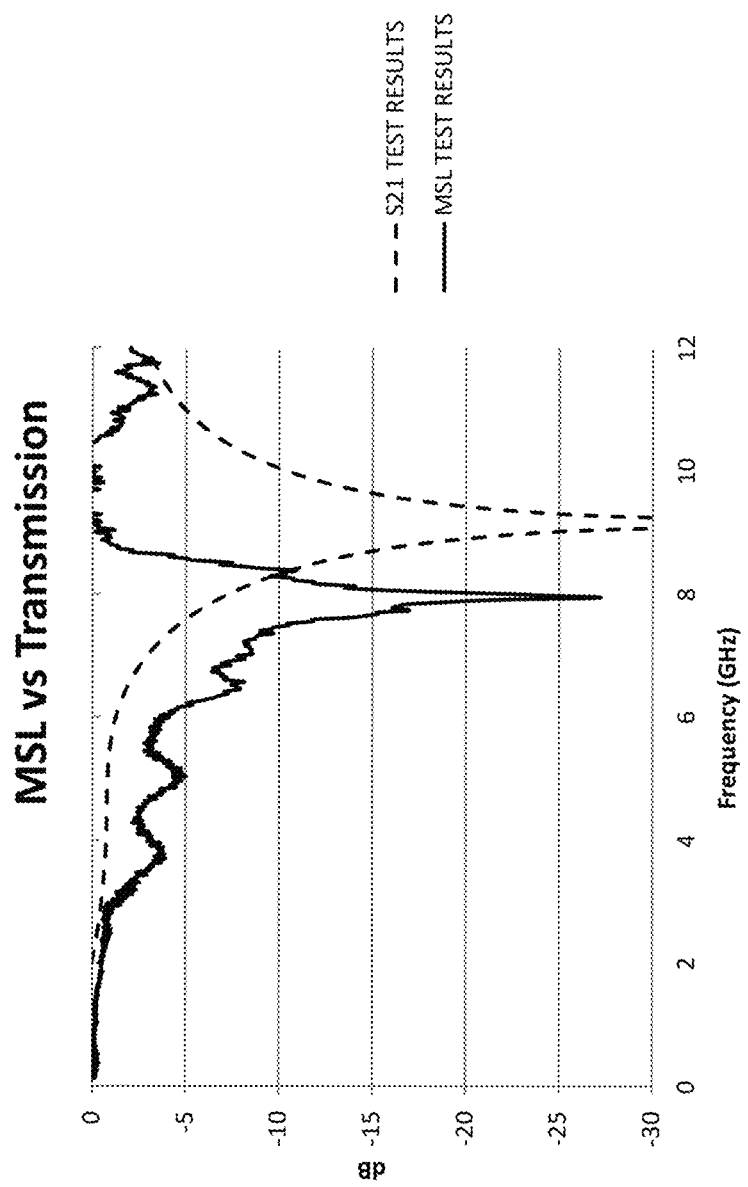

FIG. 8 is an exemplary line graph showing signal strength in decibels (dB) versus frequency in gigahertz (GHz) for first and second tests (referred to as S21 and MSL tests) in which reference signals between two antennas pointed at each other were recorded with and without an exemplary embodiment of a frequency selective structure therebetween to show bandstop capabilities of the frequency selective structure.

Figure 9:
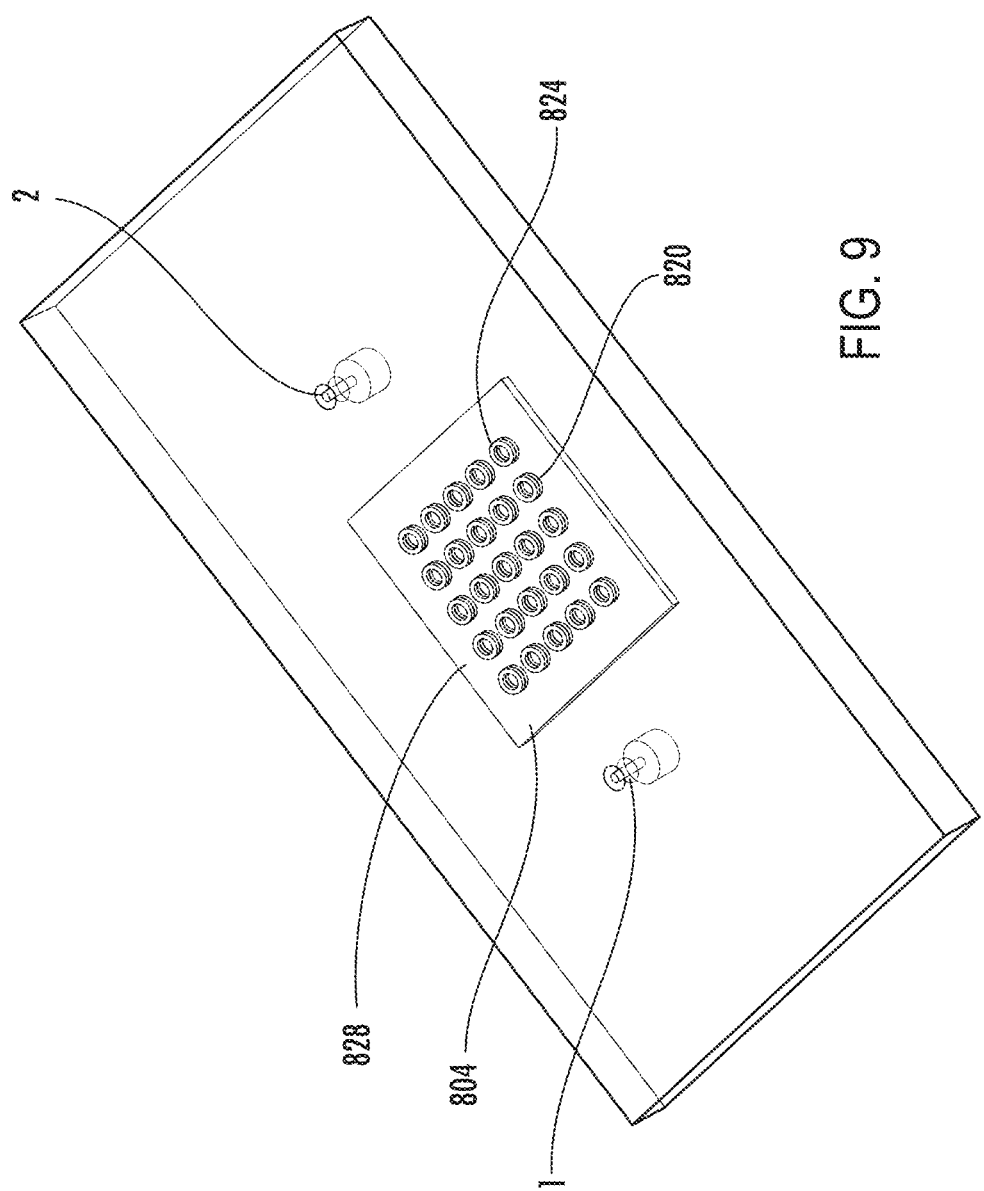

FIG. 9 illustrates an exemplary embodiment of a frequency selective structure that may be used for cavity resonance reduction inside a closed structure, where the frequency selective structure includes electromagnetic energy absorptive material applied to electrically-conductive material on a dielectric substrate and also showing the frequency selective structure disposed within a cavity resonance test fixture.

Figure 10:
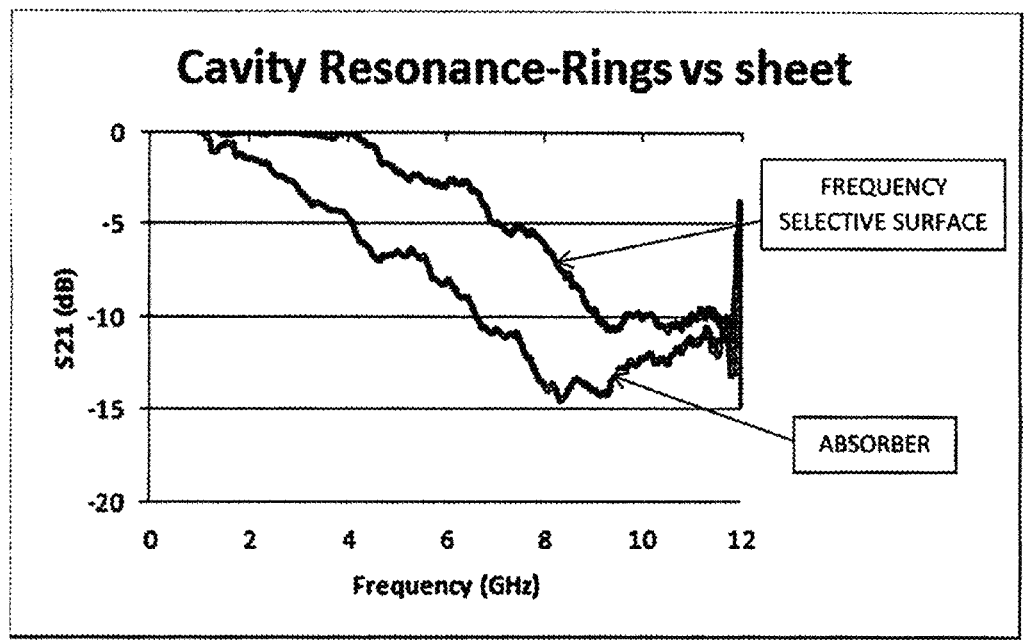

FIG. 10 is an exemplary line graph showing the amount of energy in decibels (dB) coupled from port 1 to port 2 (called S21) of a test fixture versus frequency in gigahertz (GHz) measured when frequency selective structure test samples were inside the test fixture cavity shown in FIG. 9 and also for comparison purposes measured when only a sheet of electromagnetic energy absorptive material was inside the test fixture cavity.

Figure 11:
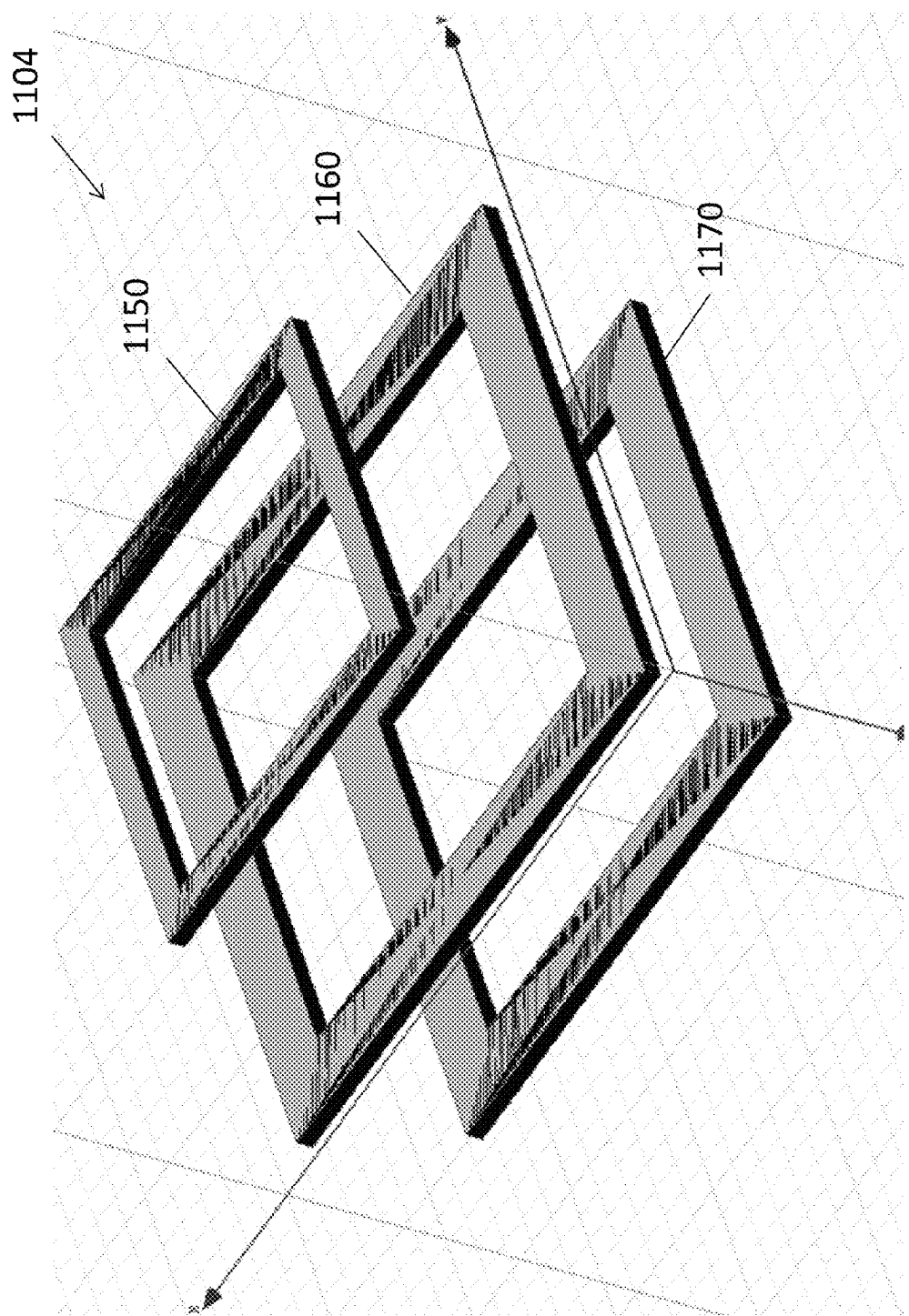

FIG. 11 illustrates an exemplary embodiment of a multi-layered or three-dimensional frequency selective structure that may be used as a single band or multiband bandstop waveguide and/or shielding structure, where the three-dimensional frequency selective structure includes multiple layers of frequency selective surfaces that are stacked on top of each other.

Figure 12:
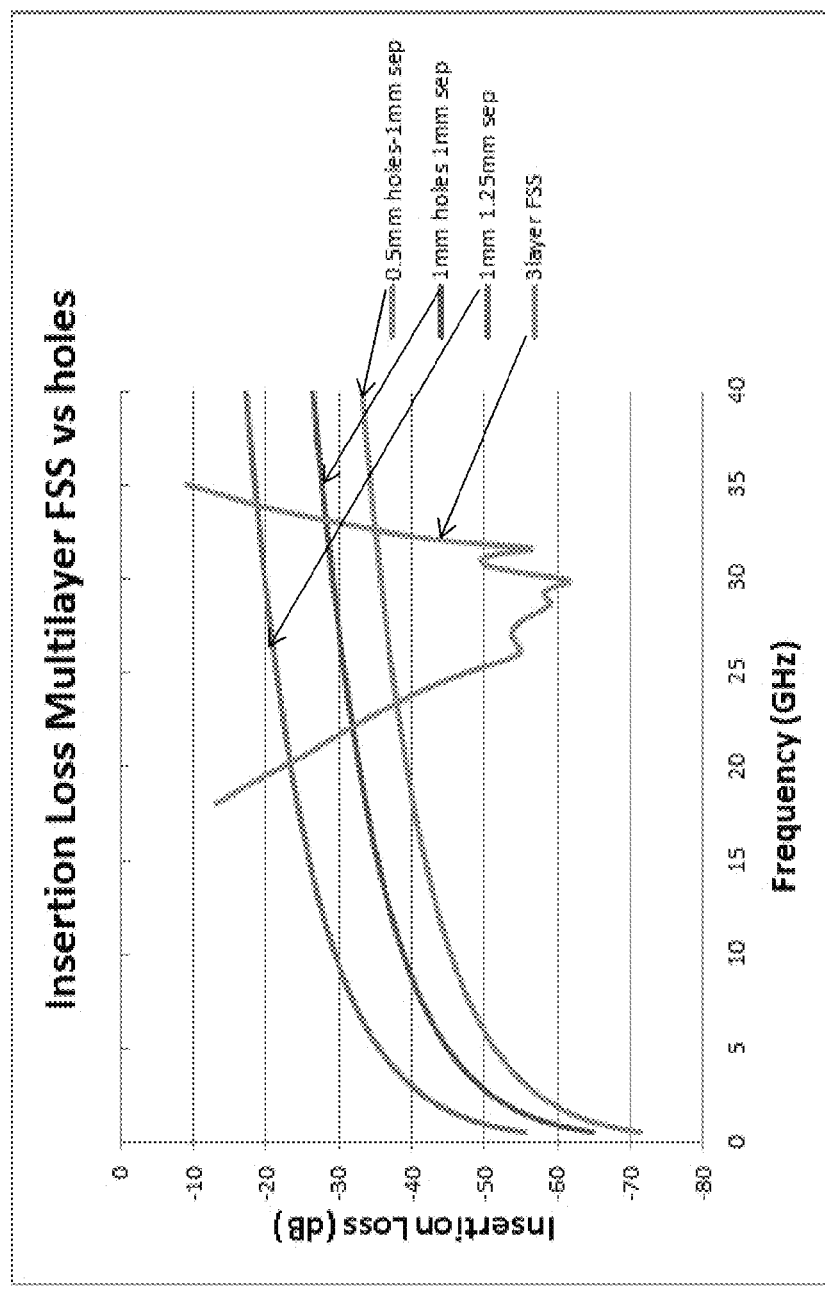

FIG. 12 is an exemplary line graph of insertion loss (or S21) in decibels (dB) versus frequency in gigahertz (GHz), where the results include actual measurements of the reference signals between two antennas pointed at each other with a prototype three-dimensional frequency selective structure between the two antennas, and modeled results of the reference signals between two antennas pointed at each other with different metallic sheets with holes between the two antennas.

Figure 13:
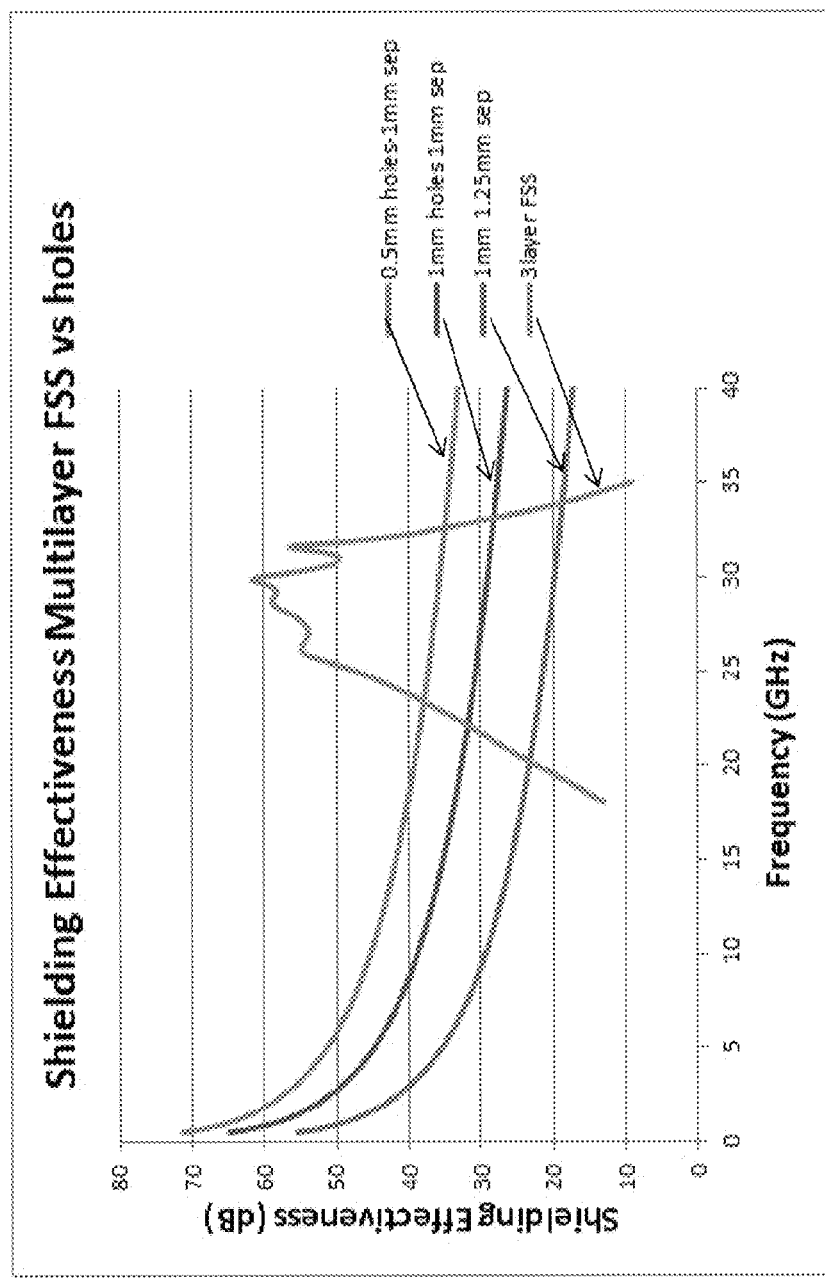

FIG. 13 is an exemplary line graph of shielding effectiveness (dB) versus frequency (GHz), where the shielding effectiveness is defined in terms of positive dB and is the negative of the insertion loss shown in FIG. 12.

DETAILED DESCRIPTION

Example embodiments will now be described more fully with reference to the accompanying drawings.

As explained above in the background, shields are commonly used to ameliorate the effects of EMI/RFI by absorbing and/or reflecting and/or redirecting EMI energy. Traditional shielding methods and materials rely on an electrically conductive surface completely enclosing a source of electromagnetic radiation. In reality, however, some gaps in the electrically conductive surface must remain to allow instrument egress and/or to allow airflow, which gaps will allow signal leakage. Electromagnetic absorbent material may be used to attenuate the signal leakage through a gap. But the absorber must completely cover the gap in order to be effective. In which case, the absorber inhibits or prevents equipment access or airflow, which is often not feasible as sometimes equipment access and/or or airflow must be maintained.

After recognizing the above, the inventors developed the disclosed exemplary embodiments that include one or more frequency selective structures, which may be used for shielding or mitigating EMI within open or closed structures. Also disclosed are methods of using one or more frequency selective structures for shielding or mitigating electromagnetic interface (EMI) within open or closed structures.

Exemplary embodiments are disclosed of single band or multiband bandstop waveguide and/or shielding structures using or including one or more frequency selective surfaces/periodic structures. Also disclosed herein are exemplary methods for attenuating electromagnetic signals through open structures or inside closed structures by using one or more frequency selective surfaces/periodic structures. The inventors have recognized the advantages in using frequency selective structures for shielding purposes in that frequency selective structures may be installed within open structures for attenuating, reflecting, blocking, redirecting, and/or absorbing electromagnetic signals through the open structures without preventing objects and airflow to pass through the open structures.

In exemplary embodiments, the frequency selective structure may have a two-dimensional form (e.g., a two-dimensional frequency selective surface or sheet, etc.) or a three-dimensional form (e.g., a three-dimensional periodic structure having a periodic pattern, multiple layers of frequency selective surfaces, etc.). The frequency selective structure may comprise a passive electromagnetic sheet or structure designed to attenuate, reflect, block, redirect, and/or absorb electromagnetic energy over one or more specific frequency bands. The frequency selective structure includes electrically-conductive and/or electromagnetic energy absorptive material in patterns, which may be located on a dielectric substrate or suspended, e.g., in air (which may be considered a dielectric). The bandstop properties exist even at very large angles of incidence, e.g., glancing or grazing angles at which the electromagnetic signals are traveling nearly parallel to the frequency selective structure. In exemplary embodiments, one or more frequency selective structures are operable for attenuating, reflecting, blocking, redirecting, attenuating, and/or absorbing electromagnetic signals which propagate through a channel, waveguide structure, vent panel, or other open structure, while still allowing egress of equipment and/or the passage of airflow.

The inventors have also recognized advantages in using frequency selective structures for attenuation of electromagnetic signals inside closed structures. Disclosed herein are exemplary embodiments of cavity resonance reduction and/or shielding structures that include frequency selective structures. The frequency selective structure is designed or configured with electrically-conductive elements that resonate at one or more bandstop frequencies. Absorber material is coupled or attached to the electrically-conductive elements. Advantageously, the inventors have found that the frequency selective structure and absorber material are capable of reducing or mitigating cavity resonance using significantly less absorber material than those existing traditional methods that use sheets of absorber operating over broad frequency bands. By targeting the desired frequency(ies), exemplary embodiments disclosed herein may provide at least equivalent or similar reduction in cavity resonance as compared to a flat absorber sheet, while also providing a significant reduction in cost due to the smaller amount of absorber needed.

The inventors have also recognized advantages in using frequency selective structures for attenuation of electromagnetic signals through open structures, which must allow airflow. For example, ventilation holes are needed in many electronic devices to allow airflow to prevent heat buildup in electronic components. But to adequately cool an electronic device, ventilation holes must be large enough to allow sufficient airflow to cool the device. But at higher frequencies (smaller wavelengths), the ventilation holes allow leakage of electromagnetic energy. In exemplary embodiments, a frequency selective structure is used in applications where ventilation or airflow is needed or desired. Advantageously, an exemplary embodiment of a frequency selective structure may include electrically-conductive elements (e.g., rings, etc.) having open areas, which open area can then be used as ventilation holes. Or, for example, an exemplary embodiment of a frequency selective structure may include multiple layers of frequency selective surfaces that may reduce airflow blockage while increasing shielding effectiveness. Accordingly, exemplary embodiments disclosed herein may provide improved performance in blocking electromagnetic energy while still allowing the airflow.

The frequency selective structure may be designed to attenuate or block electromagnetic energy at one or more specific frequencies or frequency ranges. Additionally, or alternatively, the frequency selective structure may be designed to allow passage of electromagnetic signals at one or more bandpass frequencies. For example, the frequency selective structure may be designed to allow passage of electromagnetic signals at one or more bandpass frequencies different than one or more bandstop frequencies. Or, for example, the frequency selective structure may be designed to allow passage of electromagnetic signals at one or more bandpass frequencies even when the frequency selective structure is not being used to directly control or mitigate EMI. By way of further example, the frequency selective structure may be designed with smaller open areas of the electrically-conductive elements to allow a specific frequency(ies) or frequency range(s) to pass, e.g., a single band or multiband bandpass. As the size of the open areas or ventilation holes is decreased, the frequency selective structure may be operable as a single band or multiband bandpass waveguide and/or shielding structure that also allows ventilation or airflow. The open areas of the electrically-conductive elements (e.g., rings, etc.) may be configured differently depending on the ventilation airflow requirements, shielding requirements, the frequency(ies) to be blocked, and/or the frequency(ies) to pass, etc.

The inventors have also recognized advantages in using frequency selective structures for reduction of electromagnetic interference caused by enclosed electronic devices. Electronic devices may require an enclosure to minimize EMI to other devices and/or to conform to statutory requirements. In exemplary embodiments, one or more frequency selective structures may be incorporated inside the enclosure structure to selectively block or redirect electromagnetic energy at the design frequency(ies). A frequency selective structure may be used alone or in conjunction with one or more waveguide structures, dielectric/conductive posts, and other engineered structures, for example, to guide electromagnetic energy to an area where it will be absorbed or to an area which is less critical to circuit operation.

Current approaches to EMI mitigation attempt to surround an emitter with electrically-conductive material (Faraday cage) to contain the electromagnetic energy. But the inventors hereof have recognized that the types of "Faraday cage" structures become less effective at higher frequencies as construction necessarily leaves gaps through which smaller wavelength (higher frequency) energy can leak. Accordingly, exemplary embodiments disclosed herein include frequency selective structures that are capable of blocking or redirecting electromagnetic energy even when small gaps are present.

Figure 1:
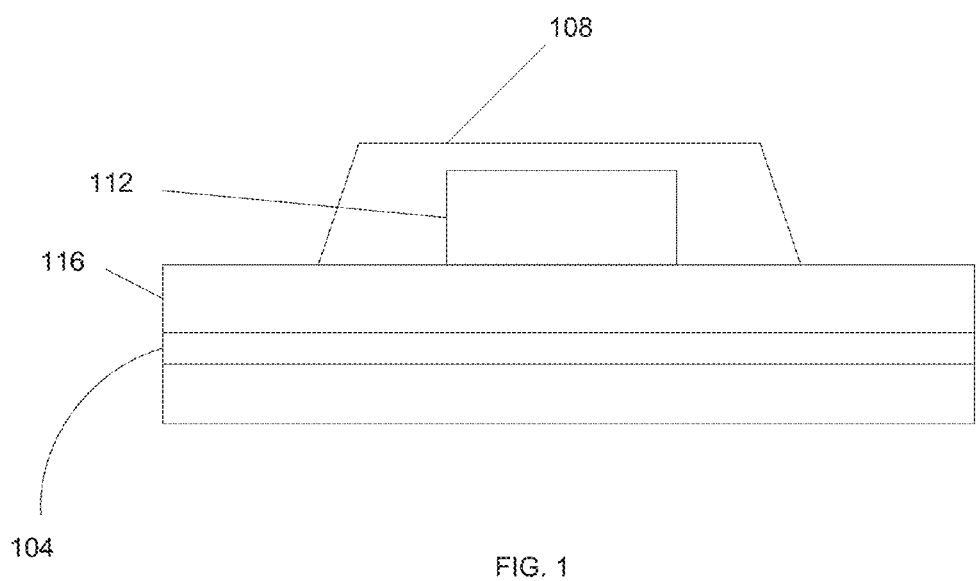

With reference now to the figures, FIG. 1 illustrates an exemplary embodiment including a single band or multi-band bandstop waveguide and/or shielding structure embodying one or more aspects of the present disclosure. This illustrated embodiment comprises first and second frequency selective structures or periodic structures 104, 108 operable for providing shielding for an integrated circuited 112 on a printed circuit board (PCB) 116. The first frequency selective structure 104 is within the PCB 116. The second frequency selective structure 108 is positioned, applied, or disposed over the integrated circuit 112. The frequency selective structures 104, 108 are operable for attenuating (e.g., reflecting, blocking, redirecting, and/or absorbing, etc.) electromagnetic signals to/from the integrated circuit 112.

The frequency selective structures 104, 108 include electrically-conductive and/or electromagnetic energy absorptive material or members in the same or different pattern (e.g., spaced apart electrically-conductive rings, etc.) for attenuating, blocking, reflecting, redirecting, and/or absorbing electromagnetic energy over one or more specific frequency(ies) or frequency band(s). In some exemplary embodiments, either or both of the frequency selective structures 104, 108 may also be configured to allow one or more specific frequency(ies) or frequency range(s) to pass, and thereby be operable as a single band or multiband bandpass waveguide and/or shielding structure.

The electrically-conductive and/or electromagnetic energy absorptive material may be in a pattern relative to a dielectric (e.g., a dielectric substrate, air, etc.). For example, the electrically-conductive and/or electromagnetic energy absorptive material may be on a top and/or bottom surface of a dielectric substrate and/or within the dielectric substrate. As another example, dielectric members may support, suspend, and/or retain electrically-conductive and/or electromagnetic energy absorbing members at spaced apart locations from each other in a pattern. In this example, the frequency selective structure may not include any dielectric substrate as the electrically-conductive and/or electromagnetic energy absorptive members may instead be suspended, e.g., in air, by the dielectric members. In a further example, the electrically-conductive and/or electromagnetic energy absorptive members may be individually attached (e.g., adhesively attached, etc.) to one or more sidewalls defining or within an open structure or a cavity of a closed structure. The electrically-conductive and/or electromagnetic energy absorptive members may be individually located along the one or more sidewalls so as to form a pattern or ordered or patterned structure. In still another example, the electrically-conductive and/or electromagnetic energy absorptive members may be embedded within or be an integral part of an open or closed structure (e.g., embedded within a sidewall of a chassis, etc.).

In exemplary embodiments that include more than one frequency selective structure, the frequency selective structures may be identical to each other or different from each other. In addition, a frequency selective structure may include any suitable number of electrically-conductive and/or electromagnetic energy absorptive members that all have the same configuration (e.g., same shape, same size, same pattern, etc.) or that do not all have the same configuration (e.g., different shape, different size, different pattern, etc.). For example, a frequency selective structure may have electrically-conductive and/or electromagnetic energy absorptive members that are shaped differently and/or sized differently to work at multiple frequencies and/or over a broader bandwidth.

Figure 2:
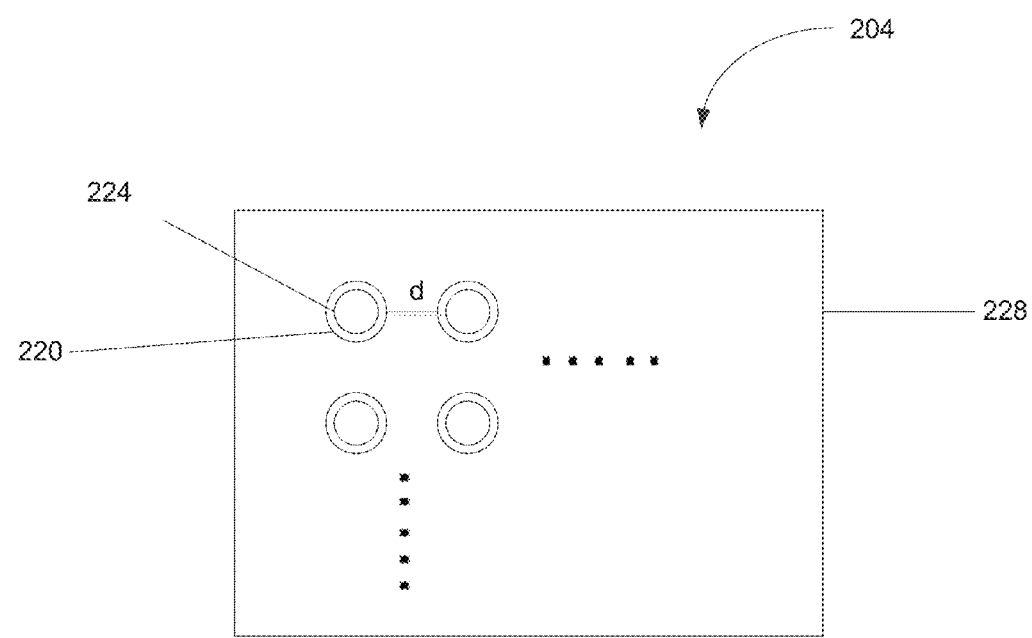
Figure 3:
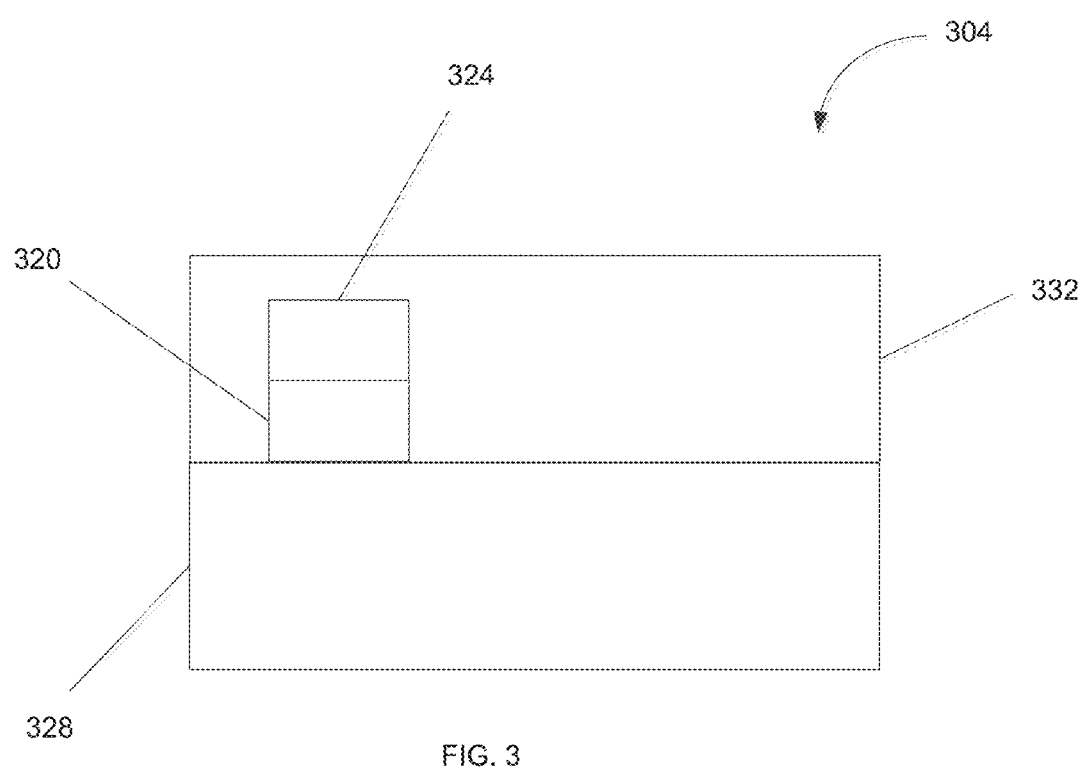
FIG. 3 illustrates an exemplary embodiment of a frequency selective structure that may be used as a single band or multiband bandstop waveguide and/or shielding structure, where the frequency selective structure includes electromagnetic energy absorptive material applied to electrically-conductive material, which is within dielectric material.
Figure 5:
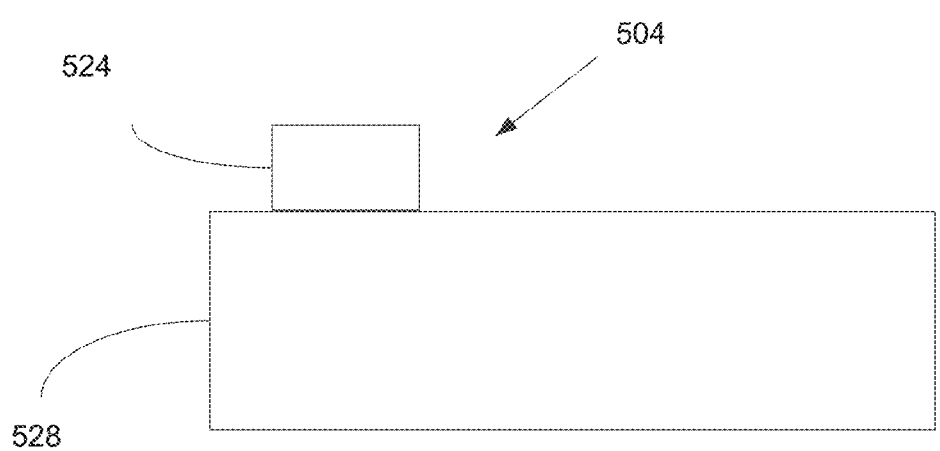
FIG. 5 illustrates an exemplary embodiment of a frequency selective structure that may be used as a single band or multiband bandstop waveguide and/or shielding structure, where the frequency selective structure includes a dielectric and electromagnetic energy absorptive material on a surface of the dielectric.
Figure 6:
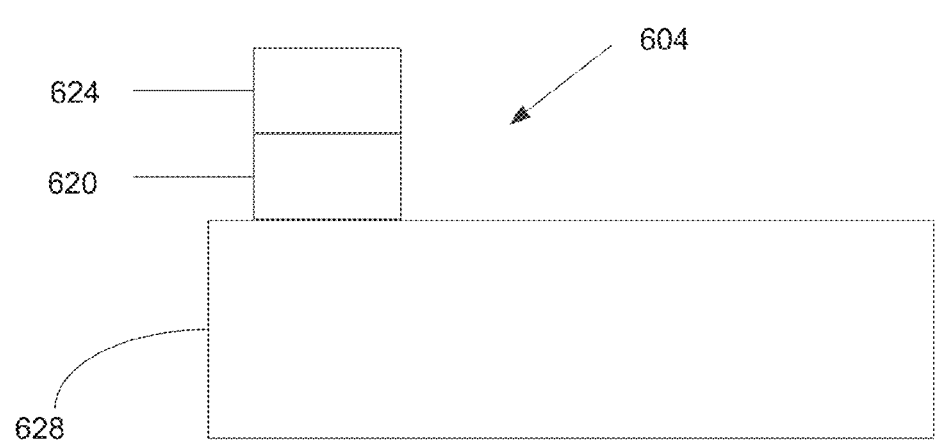
FIG. 6 illustrates an exemplary embodiment of a frequency selective structure that may be used as a single band or multiband bandstop waveguide and/or shielding structure, where the frequency selective structure includes a dielectric and electromagnetic energy absorptive material applied to electrically-conductive material on a surface of the dielectric.

In some exemplary embodiments, a frequency selective structure may have electromagnetic energy absorptive material(s) or absorber(s) on or coupled to electrically-conductive material(s) or conductor(s), such as shown in FIGS. 2, 3, and 6. For example, an electromagnetic energy absorptive material(s) or absorber(s) may be stacked on top of the electrically-conductive material(s) or conductor(s). Or, for example, an electromagnetic energy absorptive thin film(s) may be disposed over and attached to the electrically-conductive material(s) or conductor(s). As yet another example, the electrically-conductive material(s) or conductor(s) may be coated with one or more electromagnetic energy absorbing coatings. In other exemplary embodiments, a frequency selective structure includes only electromagnetic energy absorptive material(s) or absorber(s) (e.g., FIG. 5, etc.) without electrically-conductive material(s) or conductor(s). In still other exemplary embodiments, a frequency selective structure includes only electrically-conductive material(s) or conductor(s) (e.g., FIG. 4, etc.) without electromagnetic energy absorptive material(s) or absorber(s). In still further exemplary embodiments, a frequency selective structure includes electromagnetic energy absorptive material(s) or absorber(s) that are adjacent or alongside, but not stacked on top or underneath of, the electrically-conductive material(s) or conductor(s).

The illustrated embodiment of FIG. 1 includes the first and second frequency selective structures 104, 108, which are respectively within the PCB 116 and disposed over the integrated circuit 112. Alternative exemplary embodiments may include more or less than two frequency selective structures. For example, other exemplary embodiments include either a first frequency selective structure within a PCB substrate or a second frequency selective structure disposed over an integrated circuit on the PCB, but not both. Additional exemplary embodiments include a frequency selective structure on the top surface and/or bottom surface of the PCB substrate, without any frequency selective structure within the PCB substrate or disposed over an integrated circuit on the substrate. Further exemplary embodiments include more than two frequency selective structures, such as a first frequency selective structure within the PCB substrate, a second frequency selective structure disposed over an integrated circuit on the PCB, and a third frequency selective structure on the top or bottom surface of the PCB substrate. Still further exemplary embodiments include a first frequency selective structure within the PCB substrate, a second frequency selective structure disposed over an integrated circuit on the PCB, a third frequency selective structure on the top surface of the PCB substrate, and a fourth frequency selective structure on the bottom surface of the PCB substrate. Additionally, or alternatively, a frequency selective structure may be placed on another surface in the vicinity of an EMI noise path instead of, or in addition to, placement of a frequency selective structure on a circuit, within a PCB, and/or on a surface of a PCB (e.g., underneath, etc.).

FIG. 2 illustrates an exemplary embodiment of a frequency selective structure or periodic structure 204 that may be used as a single band or multiband bandstop waveguide and/or shielding structure. As represented by the series of dots and distance (d) in FIG. 2, the frequency selective structure 204 (and other frequency selective structures disclosed herein) may include any suitable number of suitably configured (e.g., shaped, sized, spaced apart, patterned, etc.) electrically-conductive and/or electromagnetic energy absorptive members (e.g., rings and/or other shapes, etc.) depending, for example, on what frequency or frequencies are to be reflected, absorbed, blocked, and/or redirected by the frequency selective structure 204. The frequency selective structure 204 may be designed, configured, or tuned to reflect, absorb, block, and/or redirect energy at one or more desired frequencies or frequency bandwidths (e.g., about 9 Gigahertz, etc.). In some exemplary embodiments, the frequency selective structure 204 may also be configured to allow one or more specific frequency(ies) or frequency range(s) to pass, such that the frequency selective structure 204 may also be operable as a single band or multiband bandpass waveguide and/or shielding structure.

In the example shown in FIG. 2, the frequency selective structure 204 includes electrically-conductive material or conductors 220 and electromagnetic energy absorptive material or absorbers 224 on or applied to the electrically-conductive material or conductors 220. FIG. 2 also illustrates a dielectric 228, which may comprise any suitable dielectric including dielectric substrate materials, air, etc. In operation, the frequency selective structure 204 reflects, absorbs, blocks, and/or redirects signals at near glancing incidence (90 degrees off normal) to stop energy. In some exemplary embodiments, the frequency selective structure 204 (and other frequency selective structures disclosed herein) may also allow other objects and/or ventilating airflow therethrough, such as when the dielectric 228 is air, etc.

FIG. 3 illustrates an exemplary embodiment of a frequency selective structure 304 that may be used as a single band or multiband bandstop waveguide and/or shielding structure. As shown in FIG. 3, an electromagnetic energy absorptive material or absorber 324 is on or applied to electrically-conductive material or electrical conductor 320. During use, the electromagnetic energy absorptive material 324 is operable for attenuating or absorbing electromagnetic signals reflected by the frequency selective structure 304. Although FIG. 3 only illustrates a single electrical conductor 320 and single absorber 324 thereon, the frequency selective structure 304 may include any suitable number of suitably configured (e.g., shaped, sized, spaced apart, patterned, etc.) electrical conductors 320 and absorbers 324 (e.g., rings and/or other shapes, etc.) depending, for example, on what frequency or frequencies are to be reflected by the frequency selective structure 304. In some exemplary embodiments, the configuration (e.g., number of, shape, size, spaced apart, pattern, etc.) of the electrical conductors 320 and absorbers 324 may also depend, for example, on whether and what frequency(ies) or frequency band(s) should be allowed to pass.

FIG. 3 also illustrates dielectrics 328 and 332. The dielectrics 328, 332 may comprise portions of the same dielectric, e.g., upper and lower portions of the same dielectric substrate. Or, the dielectrics 328, 332 may comprise different dielectrics. For example, the dielectric 328 may be a dielectric substrate and the dielectric 332 may comprise air.

Figure 4:
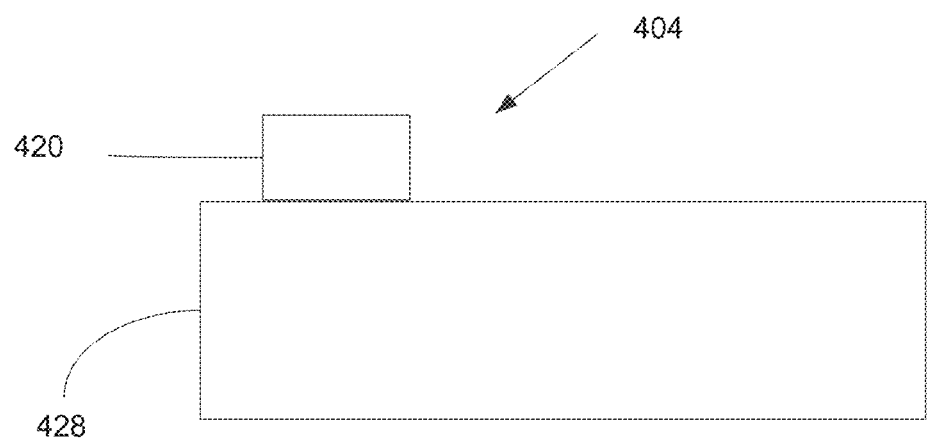
FIG. 4 illustrates an exemplary embodiment of a frequency selective structure that may be used as a single band or multiband bandstop waveguide and/or shielding structure, where the frequency selective structure includes a dielectric and electrically-conductive material on a surface of the dielectric.

FIG. 4 illustrates an exemplary embodiment of a frequency selective structure 404 that may be used as a single band or multiband bandstop waveguide and/or shielding structure. As shown in FIG. 4, the frequency selective structure 404 includes an electrically-conductive material or electrical conductor 420 on a surface of a dielectric 428. Although FIG. 4 only illustrates a single electrical conductor 420, the frequency selective structure 404 may include any suitable number of suitably configured (e.g., shaped, sized, spaced apart, patterned, etc.) electrical conductors depending, for example, on what frequency or frequencies are to be reflected by the frequency selective structure 404. In some exemplary embodiments, the electrical conductor 420 of the frequency selective structure 404 may also be configured to allow one or more specific frequency(ies) or frequency band(s) to pass, such that the frequency selective structure 404 may also be operable as a single band or multiband bandpass waveguide and/or shielding structure.

FIG. 5 illustrates an exemplary embodiment of a frequency selective structure 504 that may be used as a single band or multiband bandstop waveguide and/or shielding structure. As shown in FIG. 5, the frequency selective structure 504 includes an electromagnetic energy absorptive material or absorber 524 on a surface of a dielectric 528. Although FIG. 5 only illustrates a single absorber 524, the frequency selective structure 504 may include any suitable number of suitably configured (e.g., shaped, sized, spaced apart, patterned, etc.) absorbers 524 depending, for example, on what frequency or frequencies are to be reflected by the frequency selective structure 504. In some exemplary embodiments, the absorber 524 of the frequency selective structure 504 may also be configured to allow one or more specific frequency(ies) or frequency band(s) to pass, such that the frequency selective structure 504 may also be operable as a single band or multiband bandpass waveguide and/or shielding structure.

FIG. 6 illustrates an exemplary embodiment of a frequency selective structure 604 that may be used as a single band or multiband bandstop waveguide and/or shielding structure. As shown in FIG. 6, the frequency selective structure 604 includes an electromagnetic energy absorptive material or absorber 624 on or applied to an electrically-conductive material or conductor 620, which, in turn, is on a surface of a dielectric 628. In an alternative embodiment, the positioning of the electromagnetic energy absorptive material or absorber 624 and electrically-conductive material or conductor 620 may be reversed, such that the electrically-conductive material or conductor 620 is on or applied to an electromagnetic energy absorptive material or absorber 624. Although FIG. 6 only illustrates a single electrical conductor 620 and single absorber 624 thereon, the frequency selective structure 604 may include any suitable number of suitably configured (e.g., shaped, sized, spaced apart, patterned, etc.) electrical conductors 620 and absorbers 624 (e.g., rings and/or other shapes, etc.) depending, for example, on what frequency or frequencies are to be reflected by the frequency selective structure 604. In some exemplary embodiments, the conductor 620 and absorber 624 of the frequency selective structure 604 may also be configured to allow one or more specific frequency(ies) or frequency band(s) to pass, such that the frequency selective structure 604 may also be operable as a single band or multiband bandpass waveguide and/or shielding structure.

Figure 7:
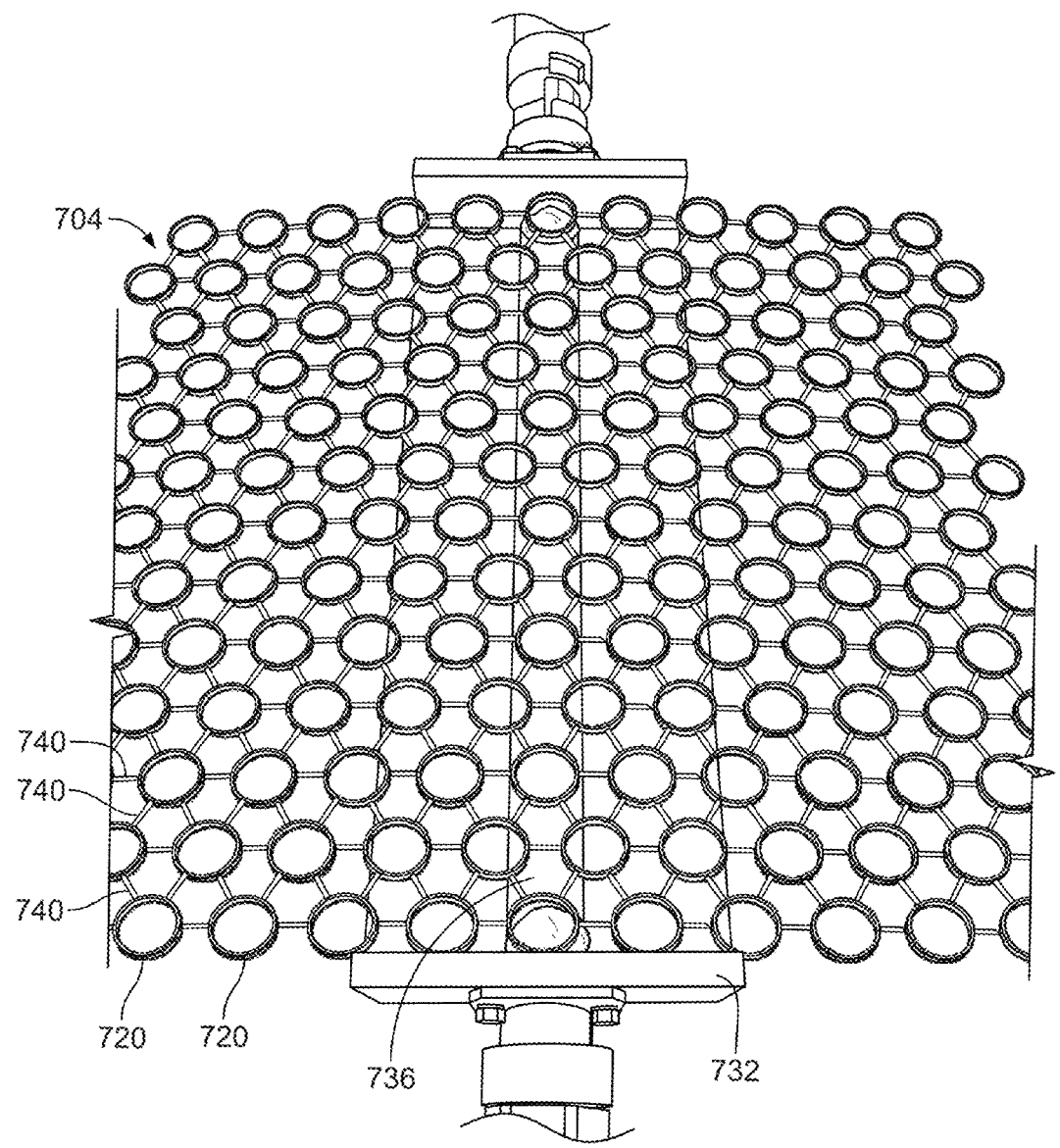
FIG. 7 illustrates an exemplary embodiment of a frequency selective structure having dielectric members and electrically-conductive rings supported by and spaced apart from each other at specific locations by the dielectric members, where the frequency selective structure is shown within a test fixture on a microstrip line for an MSL test for which the results are shown in FIG. 8.

FIG. 7 illustrates an example frequency selective structure 704 within a test fixture 732 and placed on a microstrip line 736 for MSL testing where the results are shown in FIG. 8 and described below. As shown in FIG. 7, the frequency selective structure 704 includes a plurality of electrically-conductive and/or electromagnetic energy absorptive members 720 and a plurality of dielectric members, struts, or spacers 740. The dielectric members 740 are connected to and extend between pairs of electrically-conductive and/or electromagnetic energy absorptive members 720.

In this example, the frequency selective structure 704 does not include a dielectric substrate. The electrically-conductive members and/or electromagnetic energy absorptive members 720 are instead suspended, e.g., in air (which may be considered a dielectric) and held in place by the dielectric members 740. With this configuration, a large portion of the frequency selective structure 704 is open. As shown in FIG. 7, the frequency selective structure 704 has open areas defined by the annular electrically-conductive members and/or electromagnetic energy absorptive members 720 and open areas defined between the dielectric members 740. These open areas of the frequency selective structure 704 may be used as ventilation holes. Accordingly, the frequency selective structure 704 may advantageously be used for attenuation of electromagnetic signals through open structures that require ventilating airflows, such as an electronic device that needs an airflow to prevent heat buildup in electronic components.

In this illustrated embodiment of FIG. 7, the electrically-conductive members and/or electromagnetic energy absorbing members 720 are circular rings. The plurality of dielectric members 740 are linear or straight members each of which is connected between a corresponding pair of the electrically-conductive and/or electromagnetic energy absorptive rings. The electrically-conductive members and/or electromagnetic energy absorptive members 720 are at the vertices of equilateral triangles defined by the dielectric members 740.

Continuing with this example shown in FIG. 7, the electrically-conductive members and/or electromagnetic energy absorptive members 720 may have a ring inner diameter of about 10.2 millimeters (mm) and a ring outer diameter of about 12 mm. The centers of the rings may be separated by about 17.5 mm in a hexagonal pattern. Any three adjacent rings form an equilateral triangle with sides equal to about 17.5 mm. The thickness may be about 1 mm. The dimensions provided in this paragraph are examples only as the frequency selective structure may be configured differently depending on the ventilation airflow requirements, shielding requirements, the frequency(ies) to be blocked, and/or the frequency(ies) to pass, etc. For example, the electrically-conductive members and/or electromagnetic energy absorptive members 720 may be configured (e.g., sized, shaped, etc.) to attenuate or block electromagnetic energy at one or more specific frequencies or frequency ranges. The electrically-conductive members and/or electromagnetic energy absorptive members 720 may also be configured (e.g., sized, shaped, etc.) to allow a specific frequency(ies) or frequency range(s) to pass, e.g., a single band or multiband bandpass. As the size of the open areas or ventilation holes is decreased, the frequency selective structure 704 may be operable as a single band or multiband bandpass waveguide and/or shielding structure that also allows ventilation or airflow.

The configuration shown in FIG. 7 is but one example of a possible frequency selective structure that may be used in an exemplary embodiment as other exemplary embodiments may include one or more frequency selective structures tuned to different frequencies by varying the shape, size, distance of separation, overall geometric layout, etc. of the dielectric members and/or of the electrically-conductive and/or electromagnetic energy absorptive members. Other layouts or geometries may be used for the frequency selective structure 704, such as electrically-conductive and/or electromagnetic energy absorptive members in a greater or lesser number, that are spaced apart differently (e.g., closer or farther away from each other), and/or that have different shapes, etc. For example, the electrically-conductive and/or electromagnetic energy absorptive members 720 may be non-circular, e.g., triangular, rectangular, pentagonal, hexagonal, spirals, crosses, etc. In addition, the dielectric members 740 may be non-linear and/or arranged differently to define other shapes besides the equilateral triangles or hexagonal patterns shown in FIG. 7.

In addition, the frequency selective structure 704 may be positioned within an open structure such that the frequency selective structure is operable for blocking electromagnetic signals at one or more bandstop frequencies that propagate through the open structure without completely blocking the open structure (e.g., allowing a ventilating airflow, etc.). Or, for example, the frequency selective structure 704 may be positioned within a cavity of a closed structure such that the frequency selective structure is operable for attenuating electromagnetic signals at one or more bandstop frequencies within the cavity, to thereby reduce cavity resonance and/or electromagnetic energy propagation within the cavity. As a further example, the frequency selective structure 704 may be used alone or in conjunction with one or more waveguide structures, dielectric/conductive posts, and other engineered structures, for example, to guide electromagnetic energy to an area where it will be absorbed or to an area which is less critical to circuit operation.

FIG. 8 is an exemplary line graph showing signal strength in decibels (dB) versus frequency in gigahertz (GHz) for two different tests. During the two tests, reference signals between two antennas pointed at each other was measured or recorded with and without an exemplary embodiment of a frequency selective structure therebetween. The results show bandstop capabilities of the frequency selective structure. These test results shown in FIG. 8 are provided only for purposes of illustration and not for purposes of limitation.

For the first test (called S21), the reference signal was measured or recorded between two antennas pointed at each other. Then, a frequency selective structure was inserted or positioned between the two antennas, and the reference signal is measured or recorded again. In FIG. 8, the S21 test results represent the measurements taken when the frequency selective structure was between the two antennas.

Generally, the S21 test results show that the frequency selective structure blocks, reflects, redirects, and/or absorbs energy at frequencies around 9 GHz. The level of band stoppage was better than 30 dB, which means the signal that got through was at ¹⁄₁₀₀₀th the level of the reference signal. These test results show that this exemplary embodiment including the frequency selective structure had significant bandstop capabilities at around 9 GHz. Although FIG. 8 shows that this example embodiment including the frequency selective structure blocks energy at frequencies around 9 GHz, other exemplary embodiments may include one or more frequency selective structures that are tuned to stop energy at other suitable frequency or frequencies.

The second test (called microstrip line (MSL) test) is performed on a microstrip line. The reference measurement is taken with an empty fixture. Then, a frequency selective structure 704 is placed on the upper conductor of the microstrip line 736 as shown in FIG. 7 and the signal is measured. The MSL test results in FIG. 8 show significant bandstop capabilities (e.g., level of band stoppage more than 25 dB) at around 8 GHz. Generally, the MSL test is indicative of the bandstop capabilities of a bandstop waveguide and/or shielding structure including a frequency selective structure. The signal travels parallel to the frequency selective structure during the MSL testing, and the electric and magnetic fields are perpendicular to the surface or plane of the frequency selective structure. In comparison, the energy is traveling perpendicular to the surface of the frequency selective structure during the S21 testing, and the electric and magnetic fields are parallel to the surface of the frequency selective structure.

A frequency selective structure may be designed or configured with electrically-conductive material, elements, or members that resonate at specific frequencies. In exemplary embodiments, electromagnetic energy absorptive material is applied, adhered, or otherwise attached to electrically-conductive elements. The electromagnetic energy absorptive material and/or the electrically-conductive elements may be supported by and/or coupled (e.g., attached, adhered to, etc.) a dielectric substrate. Alternatively, the frequency selective structure (e.g., 704 in FIG. 7, etc.) may not include any dielectric substrate. In an exemplary embodiment, electromagnetic energy absorptive material is adhered on top of electrically-conductive elements, which, in turn, may be adhered to a dielectric substrate or coupled together by dielectric members, etc. In use, the frequency selective structure is operable for reducing or mitigating cavity resonances and electromagnetic energy propagation (also referred to as a standing wave) inside a closed structure.

The frequency selective structure may reduce the electromagnetic energy and amount of EMI shielding needed inside the closed structure. The frequency selective structure may reduce energy in a cavity of the closed structure before the energy gets to an EMI shield. For example, the frequency selective structure may be positioned relative to (e.g., upstream of, etc.) the shield to reduce the electromagnetic energy in the cavity before the electromagnetic energy reaches the shield. In which case, the frequency selective structure may thus enhance overall shielding performance. The frequency selective structure may also be considered a cavity resonance reduction structure and/or a shielding structure or a part thereof.

By way of background, cavity resonance occurs when an electronic device is enclosed (for physical or electromagnetic protection) within an electrically-conductive box. Energy emitted by devices can resonate within the cavity. A cavity has specific frequencies at which it will resonate depending on the size or dimensions of the cavity. If the signal emitted is at one of these resonant frequencies, the cavity will resonate. This causes the electric and magnetic field to vary over the volume of the cavity, which could adversely affect the desired performance of the circuit.

Traditional cavity resonance methods utilize a thin sheet of electromagnetic absorber placed on a wall of the cavity. The absorber material is generally loaded with an absorptive filler that absorbs the magnetic field and/or the electric field. The absorber shifts the frequency of the cavity resonance and absorbs the stray energy enabling the circuit to operate properly. A traditional cavity resonance mitigation absorber operates over a broad range of frequencies. A given absorber material may be recommended for cavity resonance reduction over, e.g., a frequency range of 2 GHz to 26 GHz, etc. Cost is a factor in cavity resonance absorbers, which cost is primarily due to the absorptive filler.

A frequency selective structure is a passive electromagnetic sheet that is designed to attenuate, reflect, block, redirect, and/or absorb electromagnetic energy over one or more specific frequency bands using electrically-conductive patterns on a dielectric substrate. When placed inside a cavity, the electrically-conductive patterns will resonate at the one or more design frequencies of the frequency selective structure. In exemplary embodiments, electromagnetic energy absorptive material is attached to the electrically-conductive patterns to absorb energy and provide a cavity resonance mitigation structure. Advantageously, such exemplary embodiments may provide at least equivalent or similar reduction in cavity resonance as compared to a flat absorber sheet while also providing a significant reduction in cost due to the smaller amount of absorber needed. Exemplary embodiments of cavity resonance mitigation structure disclosed herein may be used in a wide range of applications, such as applications where absorption is needed over a narrow frequency band and does not necessarily require absorption over broad frequency bands.

FIG. 9 illustrates an exemplary embodiment of a frequency selective structure 804 embodying one or more aspects of the present disclosure. The frequency selective structure 804 may be used for cavity resonance reduction inside a closed structure. The frequency selective structure 804 may reduce energy in a cavity of the closed structure before the energy gets to a shield also within the closed structure. In this exemplary manner, the frequency selective structure 804 may thus advantageously enhance overall shielding performance. Accordingly, the frequency selective structure 804 may also be a cavity resonance reduction structure and/or a shielding structure or a part thereof.

As shown in FIG. 9, the frequency selective structure 804 includes electromagnetic energy absorptive material 824 on, applied, and/or coupled to (e.g., attached or adhered to a top surface of, etc.) electrically-conductive material 820. The electrically-conductive material 820 and electromagnetic energy absorptive material 824 are on or supported atop a surface of a dielectric 828. But in other exemplary embodiments, the frequency selective structure does not include the dielectric 828.

In alternative embodiments, the positioning of the electromagnetic energy absorptive material or absorber and electrically-conductive material or conductor may be reversed, such that the electrically-conductive material or conductor is on or applied to an electromagnetic energy absorptive material or absorber. As disclosed herein for other exemplary embodiments of a frequency selective structure, the frequency selective structure 804 may include any suitable number of suitably configured (e.g., shaped, sized, spaced apart, patterned, etc.) electrical conductors and absorbers (e.g., rings and/or other shapes, etc.) depending, for example, on the target bandstop frequency or frequencies, e.g., at which the electrical conductors and absorbers are intended to resonate.

A wide range of materials may be used for the dielectric substrate, electrically-conductive material, and electromagnetic energy absorptive material in exemplary embodiments. One example embodiment includes a dielectric foam substrate having electrically-conductive aluminum rings on the dielectric foam substrate. Electromagnetic energy absorptive material having the same ring shape as the electrically-conductive rings is adhered (e.g., using a pressure sensitive adhesive acrylic tape, etc.) or otherwise attached on top to the electrically-conductive rings. Accordingly, this exemplary embodiment includes metal backed absorber rings on a dielectric substrate. By way of example only, the electromagnetic energy absorptive material may comprise magnetically loaded, silicone rubber material (e.g., ECCOSORB® BSR, etc.). Also by way of example only, the dielectric foam substrate may comprise a closed cell, cross-linked hydrocarbon foam (e.g., ECCOSTOCK® PP-4 foam, etc.) with low dielectric loss, low dielectric constant, and low density. Alternative materials may also be used for the dielectric substrate (e.g., having a higher dielectric constant, etc.), electromagnetic energy absorptive material, and/or electrically-conductive material in other exemplary embodiments. In yet other embodiments, the frequency selective structure does not include any dielectric substrate. Instead, this example frequency selective structure includes metal backed absorber rings (e.g., aluminum backed magnetically loaded, silicone rubber rings, etc.) suspended and coupled together via dielectric supports or members extending generally between the rings, see, e.g., FIG. 7.

FIG. 10 provides performance test data measured for test samples of a frequency selective structure. The test samples and test results are provided only for purposes of illustration and not for purposes of limitation.

More specifically, FIG. 10 is an exemplary line graph showing the amount of energy in decibels (dB) coupled from port 1 to port 2 (called S21) of a test fixture versus frequency in gigahertz (GHz) measured when a few test samples were inside the test fixture cavity shown in FIG. 9. For comparison purposes, the amount of energy coupled from port 1 to port 2 was also measured when only a sheet of electromagnetic energy absorptive material was inside the test fixture cavity.

In this particular series of testing, the test fixture included a fairly large cavity having a length of 14 inches, a width of 8 inches, and a height of 0.75 inches. The input/output ports 1 and 2 of the test fixture were Type N microwave ports.

For this example series of testing, the test samples were made by the following exemplary process. Electrically-conductive aluminum having a thickness of about 0.002 inches was adhered to one side of a 12 inch by 12 inch sheet of ECCOSORB® BSR-2 having a thickness of 0.04 inches or 40 mils. ECCOSORB® BSR-2 is a magnetically loaded, silicone rubber material that is electrically non-conductive. Varying diameter rings (e.g., a ring inner diameter of about 7 mm and a ring outer diameter of about 8.5 mm, etc.) were cut in the electrically-conductive material and electromagnetic energy absorptive material using a waterjet. Sets of 4 rings of identical or substantially identical dimensions were placed on dielectric material. In this example, the dielectric material comprised a piece of ECCOSTOCK® PP-4 having a thickness of 0.125 inches. ECCOSTOCK® PP-4 is a closed cell, cross-linked hydrocarbon foam with a low density, low dielectric loss, and sufficiently low dielectric constant (k=1.05) such that it is essentially transparent to RF and microwaves. The dielectric material operates or serves to suspend the rings of electrically-conductive material and electromagnetic energy absorptive material in the center of the waveguide.

As shown in FIG. 10, there was good attenuation of the cavity resonance when a few (e.g., five or six, etc.) of the metal backed absorber rings were randomly placed in the cavity of the test fixture. Indeed, twenty to twenty five metal backed absorber rings obtained nearly equivalent attenuation as that obtained by a 4 inch by 4 inch sheet of just the absorber ECCOSORB® BSR-2. This result was surprising given that the rings contained only about 7% by volume of the electromagnetic energy absorptive material as did the 4 inch by 4 inch absorber sheet. This ability to provide good attenuation with a relatively small amount of electromagnetic energy absorptive material may provide substantial cost savings given the relative high cost of electromagnetic energy absorptive material.

By way of example, the rings may be sized with an inner diameter within a range of about 7 millimeters to about 7.5 millimeters and an outer diameter within a range from about 9 mm to about 9.5 mm, which may optimize or improve performance for 10.3 GHz. In addition, the dielectric substrate of the test samples had a thickness of about 0.125 inches. The dimensions disclosed herein are example in nature and do not limit the scope of the present disclosure, as other exemplary embodiments may include dielectric substrates with different (e.g., smaller, etc.) thicknesses, rings with different diameters, etc.

FIG. 11 illustrates an exemplary embodiment of a multi-layered or three-dimensional frequency selective structure 1104 embodying one or more aspects of the present disclosure. The frequency selective structure 1104 may be configured for use a single band or multiband bandstop waveguide and/or shielding structure.

As shown in FIG. 11, the frequency selective structure 1104 includes multiple layers of frequency selective surfaces 1150, 1160, and 1170. The frequency selective surfaces 1150, 1160, and 1170 may be stacked or layered on top of one another to form a single or unified frequency selective structure 1104. By way of example only, the three layers of frequency selective surfaces 1150, 1160, and 1170 may be attached to each other using a dielectric adhesive, a pressure sensitive adhesive, or other suitable means. The frequency selective structure 1104 may be designed, configured, or tuned to reflect absorb, block and/or redirect energy at one or more desired frequencies or frequency bandwidth (e.g., from about 20 Gigahertz (GHz) to about 27 GHz, from about 20 Gigahertz (GHz) to about 35 GHz, at about 25 GHz, at about 35 GHz, etc.). In some exemplary embodiments, a frequency selective structure may be configured to provide EMI shielding while reducing airflow blockage and/or while minimizing restriction of airflow.

The frequency selective structure 1104 may also be configured to allow a ventilating airflow through the frequency selective structure 1104. For example, FIG. 11 shows the first, second, and third layers 1150, 1160, 1170 each having an annular rectangular shape with an opening therethrough. When the layers 1150, 1160, 1170 are in a stacked arrangement, the openings or open areas of each layer 1150, 1160, 1170 aligned with each other such that a ventilating airflow may flow through the aligned openings or open areas.

In the illustrated embodiment of FIG. 11, the frequency selective structure 1104 includes three layers of frequency selective surfaces 1150, 1160, and 1170. But other exemplary embodiments may include any number of layers of frequency selective surfaces (e.g., more or less than three layers, two through ten layers, etc.).

Each of the layers of frequency selective surfaces are not necessarily the same size and same shape. Instead, exemplary embodiments may include one or more layers of frequency selective surfaces having a shape and/or size different than one or more of the other layers of frequency selective surfaces. For example, FIG. 11 shows the first, second, and third layers 1150, 1160, 1170 each having an annular rectangular shape of a different size, where the first layer 1150 is the smallest layer (e.g., a width of about 0.35 centimeters (cm), etc.) and the second layer 1160 is the largest layer (e.g., a width of about 0.7 cm, etc.). In other exemplary embodiments, a three dimensional frequency selective structure may include multiple layers of frequency selective surfaces each having the same shape and/or the same size.

The frequency selective structure 1104 may be configured to allow one or more specific frequency(ies) or frequency range(s) to pass, such that the frequency selective structure 1104 may also be operated as a single band or multiband bandpass waveguide and/or shielding structure. In some exemplary embodiments, the layers of frequency selective surfaces may be of any shape (e.g., rectangular, circular, triangular, etc.) and/or size, e.g., to work at multiple frequencies and/or over a broader bandwidth, etc.

The frequency selective structure 1104 may include electrically-conductive material, and/or conductors and electromagnetic energy absorptive material, and/or absorbers on or applied to electrically-conductive material or conductors. In the exemplary embodiment of the frequency selective structure 1104 shown in FIG. 11, each of the three layers of frequency selective surfaces 1150, 1160, 1170 comprise electrically-conductive elements. In alternative embodiments, each layer of a multilayered frequency selective structure does not necessarily include only electrically-conductive elements. For example, an exemplary embodiment of a frequency selective structure may include one or more layers of electrically-conductive elements without any absorber, one or more layers of electromagnetic energy absorptive material without any electrically-conductive elements, and/or one or more layers of electrically-conductive elements with absorber thereon.

The frequency selective structure 1104 may include a dielectric, which may comprise any suitable dielectric including dielectric substrate materials, air, etc. In operation, the frequency selective structure 1104 reflects, absorbs, blocks, and/or redirects signals at near glancing incidence (90 degrees off normal) to stop energy. In some exemplary embodiments, the frequency selective structure 1104 (and other frequency selective structures disclosed herein) may also allow other objects and/or ventilating airflow therethrough.

FIG. 12 is an exemplary line graph of insertion loss (or S21) in decibels (dB) versus frequency in gigahertz (GHz). The results shown in FIG. 12 were obtained by actual measurements of the reference signals between two antennas pointed at each other with a prototype of a three-dimensional or multilayered frequency selective structure between the two antennas. For comparison purposes, FIG. 12 also includes modeled results of the reference signals between two antennas pointed at each other with different traditional shielding materials (i.e., metallic sheets with holes) between the two antennas. More specifically, the modeled S21 test results generally show the signal strength between the two antennas with a corresponding one of the three different metallic sheets with holes positioned between the two antennas. A first metallic sheet had 0.5 diameter mm holes separated by 1 mm. A second metallic sheet had 1 diameter mm holes separated by 1 mm. A third metallic sheet had 1 mm diameter holes separated by 1.25 mm.

FIG. 13 is an exemplary line graph of shielding effectiveness (dB) versus frequency (GHz). The shielding effectiveness is defined in terms of positive decibels. The shielding effectiveness shown in FIG. 13 is the negative of the insertion loss shown in FIG. 12.

FIGS. 12 and 13 generally demonstrate the bandstop capabilities of the three-dimensional frequency selective structure and the bandstop capabilities of each of the three different metallic sheets with holes. FIG. 12 generally shows that the three-dimensional frequency selective structure blocks, reflects, redirects, and/or absorbs energy better than all three metallic sheets with holes for frequencies between about 24 GHz to about 33 GHz. For example, the insertion loss (FIG. 12) and the shielding performance (FIG. 13) for the three-dimensional frequency selective structure was better than the third metallic sheet having 1 mm diameter holes separated by 1.25 mm at frequencies between around 20 GHz to 35 GHz, better than the second metallic sheet having 1 mm diameter holes separated by 1 mm at frequencies between around 23 GHz to 34 GHz, and better than the first metallic sheet having 0.5 diameter mm holes separated by 1 mm for frequencies between about 24 GHz to about 33 GHz.

The level of band stoppage was better than 60 dB at about 30 GHz, which means the signal that got through was at ¹⁄₁₀₀₀₀₀₀ the level of the reference signal. FIGS. 12 and 13 also shows that this exemplary embodiment of the three-dimensional frequency selective structure effectively blocks energy at frequencies from about 20 GHz to about 35 GHz with a peak or maximum insertion loss and shielding effective at a frequency of about 30 GHz (e.g., insertion loss of about negative 60 dB (FIG. 12), shielding effectiveness of about 60 dB (FIG. 13), etc.). Although FIGS. 12 and 13 shows that this example embodiment of the three-dimensional frequency selective structure effectively blocks energy at frequencies from about 20 GHz to about 35 GHz, other exemplary embodiments of three-dimensional frequency selective structures may be tuned for energy blockage at other suitable frequency(ies) or frequency range(s). With the multilayered approach disclosed herein, exemplary embodiments may thus include multiple layers of frequency selective surfaces tuned to create a broader band frequency range for energy blockage. The results shown in FIGS. 12 and 13 are provided only for purposes of illustration and not for purpose of limitation, as other exemplary embodiments may be configured differently, e.g., tuned for a different frequency range for energy blockage, etc.

A wide range of materials may be used for the electrically-conductive members or electrical conductors (e.g., 220, 320, 420, 620, 720, 820, etc.) in exemplary embodiments that include electrically-conductive members or electrical conductors. Example materials include metals (e.g., copper, nickel/copper, silver, aluminum, etc.), electrically-conductive composite materials, etc. Some exemplary embodiments include electrically-conductive members or electrical conductors comprising electrically-conductive pressure sensitive adhesive, such as an electrically-conductive pressure sensitive adhesive from Laird. By way of example only, an exemplary embodiment includes one or more frequency selective structures having electrically-conductive members made of Laird's black conductive fabric tape 86250 tape, which is a nickel/copper metallized fabric with an electrically-conductive pressure sensitive adhesive. By way of further example, another exemplary embodiment includes one or more frequency selective structures having electrically-conductive and/or electromagnetic energy absorptive members made of a corresponding electrically-conductive and/or electromagnetic energy absorptive pressure sensitive adhesive. Another exemplary embodiment includes one or more frequency selective structures comprising electrically-conductive aluminum members, elements, or patterns.

A wide range of dielectrics may also be used in exemplary embodiments disclosed herein. For example, the dielectric members (e.g., 740 (in FIG. 7) etc.) connected to electrically-conductive and/or electromagnetic energy absorptive members (e.g., 720, etc.) in exemplary embodiments may be made of plastics (e.g., acrylonitrile butadiene styrene (ABS) plastic, etc.), electrically non-conductive pressure sensitive adhesives, etc. In an exemplary embodiment, the dielectric members 740 are made of ABS plastic. In another exemplary embodiment, the dielectric members 740 are made of electrically non-conductive or dielectric pressure sensitive adhesive.

A wide range of materials may be used for a dielectric substrate (e.g., 228, 328, 428, 528, 628, 828, etc.) in exemplary embodiments that include a dielectric substrate. Exemplary dielectric materials include plastics (e.g., ABS plastic, Mylar plastic, etc.), composite materials (e.g., FR4 composite material, etc.), flexible, and/or thermally conductive materials. An exemplary embodiment includes a frequency selective structure having a dielectric substrate comprising ABS plastic. Another exemplary embodiment includes a frequency selective structure having a dielectric substrate comprising FR4 composite material, which includes woven fiberglass cloth with an epoxy resin binder that is flame resistant. An additional exemplary embodiment includes a frequency selective structure having a dielectric foam substrate, such as a closed cell, cross-linked hydrocarbon foam (e.g., ECCOSTOCK® PP-4 foam, etc.) with low dielectric loss, low dielectric constant, and low density.

In some exemplary embodiments, the frequency selective structure (e.g., 704 in FIG. 7, etc.) does not include any dielectric substrate. The lack of a dielectric substrate may allow for better airflow. By way of example, a frequency selective structure may include electrically-conductive members and/or electromagnetic energy absorptive members that are suspended without any dielectric substrate and held in place by dielectric members extending between the electrically-conductive members and/or electromagnetic energy absorptive members. By way of further example, the electrically-conductive and/or electromagnetic energy absorptive members may be individually attached (e.g., adhesively attached, etc.) to one or more sidewalls of an open structure or a closed structure. For example, electrically-conductive and/or electromagnetic energy absorptive may be adhesively attached to one or more interior sidewalls within a cavity of a closed structure. The electrically-conductive and/or electromagnetic energy absorptive members may be individually located along the one or more sidewalls so as to form a pattern or ordered or patterned structure. In still another example, the electrically-conductive and/or electromagnetic energy absorptive members may be embedded within or be an integral part of an open or closed structure (e.g., embedded within a sidewall of a chassis, etc.).

A frequency selective structure (e.g., 104, 204, 304, 404, 504, 604, 704, 804, 1104, etc.) with or without a dielectric substrate may be positioned within an open structure such that the frequency selective structure is operable for blocking electromagnetic signals at one or more bandstop frequencies that propagate through the open structure without completely blocking the open structure. Or, for example, a frequency selective structure (e.g., 104, 204, 304, 404, 504, 604, 704, 804, 1104, etc.) with or without a dielectric substrate may be positioned within a cavity of a closed structure such that the frequency selective structure is operable for attenuating electromagnetic signals at one or more bandstop frequencies within the cavity, to thereby reduce cavity resonance and/or electromagnetic energy propagation within the cavity. As a further example, a frequency selective structure (e.g., 104, 204, 304, 404, 504, 604, 704, 804, 1104, etc.) with or without a dielectric substrate may be used as a signal conditioner where the frequency selective structure is configured or tailored with repetitive structures to take out or remove certain frequency components from signals. As yet another example, a frequency selective structure (e.g., 104, 204, 304, 404, 504, 604, 704, 804, 1104, etc.) with or without a dielectric substrate may be used as a waveguide to "steer" harmful EMI to less sensitive areas and/or to change an electronic box electromagnetic signature for acceptable performance.

In some exemplary embodiments, a frequency selective structure may be flexible and/or thermally conductive (e.g., have a thermal conductivity greater than air, have a thermal conductivity greater than 0.5 Watts per meter per Kelvin (w/mK), etc.). By way of example, an exemplary embodiment includes a frequency selective structure having sufficient flexibility to allow it to be applied to virtually any part of a device even after the device has been designed and manufactured. For example, a frequency selective structure may be applied to or over an electronic component on a PCB post-manufacture or after the PCB and electronic component are manufactured.

In an exemplary embodiment, a flexible frequency selective structure includes electrically non-conductive or dielectric members and/or a substrate comprising ABS plastic. Also in this exemplary embodiment, the frequency selective structure includes electrically-conductive members comprising electrically-conductive pressure sensitive adhesive (e.g., Laird's black conductive fabric tape 86250 tape, etc.). In another exemplary embodiment, a flexible frequency selective structure includes electrically-conductive members comprising copper and a substrate comprising Mylar. In this example, the copper pattern is etched onto the Mylar using FR4/PCB manufacturing processes, which has the advantage of being thinner and perhaps easier to manufacture.

In some exemplary embodiments, a frequency selective structure includes electromagnetic energy absorptive material. During use, the electromagnetic energy absorptive material is operable for attenuating the electromagnetic signals reflected by the frequency selective structure. A wide range of electromagnetic energy absorptive materials may be used in some exemplary embodiments (e.g., FIG. 2, FIG. 3, FIG. 5, FIG. 6, FIG. 7, FIG. 11, etc.), including absorbing particles, fillers, flakes, etc. and/or made of various electrically conductive and/or magnetic materials, such as carbonyl iron, SENDUST (an alloy containing about 85% iron, 9.5% silicon and 5.5% aluminum), permalloy (an alloy containing about 20% iron and 80% nickel), iron silicide, iron-chrome compounds, metallic silver, magnetic alloys, magnetic powders, magnetic flakes, magnetic particles, nickel-based alloys and powders, chrome alloys, and any combinations thereof, etc. By way of example only, an exemplary embodiment of a frequency selective structure may include an electromagnetic energy absorptive material from Laird and/or as disclosed in U.S. Pat. No. 7,135,643, the entire contents of which is incorporated herein. Also by way of example only, another exemplary embodiment of a frequency selective structure may include an electromagnetic energy absorptive material comprising magnetically loaded, silicone rubber material (e.g., ECCOSORB® BSR, etc.).

As disclosed herein, exemplary embodiments may include electrically-conductive members or electromagnetic energy absorptive members. Additional exemplary embodiments may also include both electrically-conductive members and electromagnetic energy absorptive members, which are adjacent, abutting one another, or in a stacked arrangement (e.g., electromagnetic energy absorptive members are stacked on electrically-conductive members, or vice versa, etc.). Other exemplary embodiments may include members that are configured to be electrically-conductive and electromagnetic energy absorptive.

In some exemplary embodiments, a frequency selective structure may include a thermally conductive, electromagnetic energy absorptive material. In which case, the thermally conductive, electromagnetic energy absorptive material may be operable for attenuating the electromagnetic signals reflected by the frequency selective structure while also allowing the frequency selective structure to be used in close proximity to or in contact with (e.g., form part of a heat path, etc.) integrated circuits, other heat generating electronic components, heat sinks, etc. In an exemplary embodiment, a frequency selective structure includes thermally conductive, electromagnetic energy absorptive composite material from Laird and/or as disclosed in U.S. Pat. No. 7,608,326, the entire contents of which is incorporated herein.

In some exemplary embodiments, a single band or multiband bandstop waveguide and/or shielding structure having a frequency selective structure may also be configured to exhibit or have thermally conductive properties. The substrate of the frequency selective structure may be thermally conductive, e.g., have a thermal conductivity of at least 0.5 Watts per meter per Kelvin (W/mK) or more, have a thermal conductivity greater than air, etc. In an exemplary embodiment, a frequency selective structure includes a substrate comprising a composite material loaded with thermally conductive filler. In exemplary embodiments in which a single band or multiband bandstop waveguide and/or shielding structure has or exhibits thermally conductive properties, the thermally conductive properties may enable the bandstop waveguide and/or shielding structure to be used in close proximity to or in contact with integrated circuits, other heat generating electronic components, heat sinks, etc. For example, a thermally conductive bandstop waveguide and/or shielding structure may be used adjacent or in contact with one or more heat generating components such that at least a portion of the thermally conductive bandstop waveguide and/or shielding structure (e.g., substrate or electrically-conductive members of the frequency selective structure, etc.) defines or includes part of a thermally conductive heat path from the one or more heat generating components to a heat sink.

In some exemplary embodiments, the frequency selective structure has a flexible structure that may be incorporated in, integrated or integral with, applied, etc. on a surface, above, or inside a circuit board, such as after the regular manufacturing process. The frequency selective structure may be conformable and/or heat cured over a board in some exemplary embodiments. A frequency selective structure may be arranged normal to a board in a series in some exemplary embodiments. By way of example, a frequency selective structure may be configured to be conformable to a mating surface and/or to have stiffness and flexibility properties similar to printed circuit board substrates.

Advantageously, exemplary embodiments including frequency selective structures usable as single band or multi-band bandstop waveguide and/or shielding structures disclosed herein may provide one or more (but not necessarily any or all) of the following advantages. For example, exemplary embodiments may provide attenuation of electromagnetic signals through open structures while allowing other objects and airflow through the open structures. A bandstop waveguide and/or shielding structure may be positioned or installed within an open structure (e.g., opening, gap, channel, etc.) such that it is operable for attenuating electromagnetic signals or energy through the open structure without preventing access to equipment or an airflow through the open structure. A frequency selective structure may be used in applications where ventilation or airflow is needed or desired, as the open areas of the frequency selective structure can be used as ventilation holes. Accordingly, a cooling airflow may flow through the open structure and/or equipment may be accessed (e.g., for testing, repair, maintenance, replacement, etc.) via the open structure even while the bandstop waveguide and/or shielding structure remains installed or positioned within the open structure. A tool or testing device may be inserted through the opening, gap, channel, or other open structure because the installed bandstop waveguide and/or shielding structure does not completely block the opening, gap, channel, or other open structure. This is unlike some existing traditional shielding or absorbing structures that operate by completely blocking the opening, gap, channel, or other open structure in which they are installed.

In addition, exemplary embodiments including frequency selective structures may also provide one or more (but not necessarily any or all) of the following advantages when used for attenuation of electromagnetic signals inside closed structures. For example, the inventors have found that a frequency selective structure with absorber material attached thereto may reduce or mitigate cavity resonance using significantly less absorber material than existing traditional methods that use a sheet of absorber operating over a broad frequency band. In some exemplary embodiments, a primary function of a frequency selective structure is to reduce cavity resonances and electromagnetic energy propagation inside a closed structure. Also in some exemplary embodiments, the frequency selective structure has a secondary function, which is to reduce the electromagnetic energy and amount of EMI shielding needed inside the closed structure. In these exemplary embodiments, the frequency selective structure may thus reduce energy in a cavity before the energy gets to the shield, whereby the frequency selective structure thus advantageously enhances overall shielding performance.

A frequency selective structure may be designed to attenuate or block electromagnetic energy at one or more specific frequencies or frequency ranges. The frequency selective structure may be designed with smaller open areas of the electrically-conductive elements to allow a specific frequency(ies) or frequency range(s) to pass, e.g., a single band or multiband bandpass. As the size of the open areas is decreased, the frequency selective structure may be operable as a single band or multiband bandpass waveguide and/or shielding structure that also allows ventilation or airflow. A frequency selective structure may be used alone or in conjunction with one or more waveguide structures, dielectric/conductive posts, and other engineered structures, for example, to guide electromagnetic energy to an area where it will be absorbed or to an area which is less critical to circuit operation. As an example, the frequency selective structure may be used as a waveguide to "steer" or direct harmful EMI to less sensitive areas and/or to change an electronic box electromagnetic signature for acceptable performance. As another example, the frequency selective structure may be designed to allow passage of electromagnetic signals at one or more bandpass frequencies even when the frequency selective structure is not being used to directly control or mitigate.

Frequency selective structures disclosed herein may be formed using various methods or techniques. By way of example, a frequency selective structure may be formed as a three-dimensional period structure using three-dimensional printing techniques. By way of further example, a frequency selective structure may be formed as a three-dimensional or multilayered structure that includes multiple layers of frequency selective surfaces. A frequency selective structure may be applied (e.g., 3D printed, etc.) on a board and/or in a board using thru-hole vias, which vias are currently only used to connect ground through all layers of the board. A frequency selective structure may be incorporated in one or more predetermined or particular areas of a board separating out different sections. A frequency selective structure made using 3D printing techniques may also be configured to allow airflow.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two-particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally," "about," and "substantially," may be used herein to mean within manufacturing tolerances. Or for example, the term "about" as used herein when modifying a quantity of an ingredient or reactant of the invention or employed refers to variation in the numerical quantity that can happen through typical measuring and handling procedures used, for example, when making concentrates or solutions in the real world through inadvertent error in these procedures; through differences in the manufacture, source, or purity of the ingredients employed to make the compositions or carry out the methods; and the like. The term "about" also encompasses amounts that differ due to different equilibrium conditions for a composition resulting from a particular initial mixture. Whether or not modified by the term "about," the claims include equivalents to the quantities.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A multilayered frequency selective structure for shielding or mitigating electromagnetic interference (EMI) without completely blocking an airflow therethrough, the multilayered frequency selective structure comprising multiple layers of frequency selective surfaces.

2. The multilayered frequency selective structure of claim 1, wherein the multiple layers of frequency selective surfaces are configured to be collectively operable for energy blockage across a broad band frequency range.

3. The multilayered frequency selective structure of claim 1, wherein the multilayered frequency selective structure is configured to be operable for energy blockage across a frequency range.

4. The multilayered frequency selective structure of claim 3, wherein the multilayered frequency selective structure is configured to be operable for energy blockage across a frequency range from about 20 Gigahertz to about 35 Gigahertz.

5. The multilayered frequency selective structure of claim 1, wherein the multilayered frequency selective structure is configured to be operable across a frequency range from about 20 Gigahertz to about 35 Gigahertz with a shielding effectiveness of at least about 20 decibels.

6. The multilayered frequency selective structure of claim 1, wherein the multilayered frequency selective structure is configured to be operable with a shielding effectiveness of at least 60 decibels and/or a maximum shielding effectiveness at a frequency of about 30 Gigahertz.

7. The multilayered frequency selective structure of claim 1, wherein each of the multiple layers of frequency selective surfaces includes at least one opening therethrough aligned with at least one opening through the other multiple layers of frequency selective surfaces such that an airflow may flow through the aligned openings of the multiple layers of frequency selective surfaces, whereby the multilayered frequency selective structure is configured to be operable for shielding or mitigating electromagnetic interference (EMI) without completely blocking an airflow therethrough.

8. The multilayered frequency selective structure of claim 1, wherein:
   each of the multiple layers of frequency selective surfaces has an annular shape with an opening that is aligned with the opening of each of the other multiple layers of frequency selective surfaces; and
   the aligned openings of the multiple layers of frequency selective surfaces allow a ventilating airflow through the multilayered frequency selective structure.

9. The multilayered frequency selective structure of claim 1, wherein the multiple layers of frequency selective surfaces include first, second, and third layers of frequency selective surfaces in a stacked arrangement with the second layer disposed between the first and third layers.

10. The multilayered frequency selective structure of claim 9, wherein:
   each of the first, second, and third layers of frequency selective surfaces have an annular rectangular shape with an opening; and the openings of the first, second, and third layers of frequency selective surfaces allow an airflow through the multilayered frequency selective structure.

11. The multilayered frequency selective structure of claim 9, wherein the second layer is adhesively attached to the first and third layers.

12. The multilayered frequency selective structure of claim 1, wherein each of the multiple layers of frequency selective surfaces comprises:
   electrically-conductive members; or
   electromagnetic energy absorptive members; or
   electrically-conductive, electromagnetic energy absorptive members; or
   electrically-conductive members and electromagnetic energy absorptive members.

13. The multilayered frequency selective structure of claim 1, wherein each of the multiple layers of frequency selective surfaces comprises electrically-conductive members and electromagnetic energy absorptive material applied to the electrically-conductive members.

14. A method comprising stacking multiple layers of frequency selective surfaces to thereby provide a multilayered frequency selective structure configured for shielding or mitigating electromagnetic interference (EMI) without completely blocking an airflow through the multilayered frequency selective structure.

15. The method of claim 14, wherein stacking multiple layers of frequency selective surfaces includes aligning at least one opening through each of the multiple layers of frequency selective surfaces with at least one opening of each of the other multiple layers of frequency selective surfaces such than an airflow may flow through the aligned openings of the multiple layers of frequency selective surfaces.

16. The method of claim 14, wherein each of the multiple layers of frequency selective surfaces comprises:
   electrically-conductive members; or
   electromagnetic energy absorptive members; or
   electrically-conductive, electromagnetic energy absorptive members; or
   electrically-conductive members and electromagnetic energy absorptive members.

17. The method of claim 14, wherein each of the multiple layers of frequency selective surfaces comprises electrically-conductive members and electromagnetic energy absorptive material applied to the electrically-conductive members.

18. A method comprising positioning a multilayered frequency selective structure including multiple layers of frequency selective surfaces relative to one or more electronic components such that the multilayered frequency selective structure is operable for shielding or mitigating electromagnetic interference (EMI) without completely blocking a ventilating airflow for helping reduce heat buildup in the one or more electronic components.

19. The method of claim 18, wherein each of the multiple layers of frequency selective surfaces includes at least one opening aligned with at least one opening of each of the other multiple layers of frequency selective surfaces such than an airflow may flow through the aligned openings of the multiple layers of frequency selective surfaces.

20. The method of claim 18, wherein each of the multiple layers of frequency selective surfaces comprises electrically-conductive members and electromagnetic energy absorptive material applied to the electrically-conductive members.

* * * * *